United States Patent [19]

Hieda et al.

[11] Patent Number: 5,106,774
[45] Date of Patent: Apr. 21, 1992

[54] METHOD OF MAKING TRENCH TYPE DYNAMIC RANDOM ACCESS MEMORY DEVICE

[75] Inventors: Katsuhiko Hieda, Yokohama; Fumio Horiguchi, Kawasaki; Takeshi Hamamoto, Kawasaki; Akihiro Nitayama, Kawasaki; Kazumasa Sunouchi, Yokohama; Kei Kurosawa, Tokyo; Fujio Masuoka, Yokohama, all of Japan

[73] Assignee: Kabushiki Kaisha Toshiba, Kawasaki, Japan

[21] Appl. No.: 650,992

[22] Filed: Feb. 4, 1991

Related U.S. Application Data

[63] Continuation of Ser. No. 216,398, Jul. 8, 1988, abandoned.

[30] Foreign Application Priority Data

Jul. 10, 1987 [JP] Japan .................. 62-172239
Jul. 29, 1987 [JP] Japan .................. 62-189405

[51] Int. Cl.⁵ ............................ H01L 21/70
[52] U.S. Cl. .................. 437/52; 437/47; 437/48; 437/60; 437/162; 437/228; 437/919
[58] Field of Search .......... 437/38, 47, 48, 52, 437/60, 69, 162, 164, 191, 193, 195, 223, 228, 233, 235, 919; 357/236, 51

[56] References Cited

U.S. PATENT DOCUMENTS

| 4,569,701 | 2/1986 | Oh | 437/164 |
| 4,604,150 | 8/1986 | Lin | 437/162 |
| 4,645,564 | 2/1987 | Morie et al. | 437/228 |
| 4,676,847 | 6/1987 | Lin | 437/162 |
| 4,755,486 | 7/1988 | Treichel et al. | 437/164 |
| 4,782,036 | 11/1988 | Becker et al. | 437/164 |

FOREIGN PATENT DOCUMENTS

| 0085988 | 8/1983 | European Pat. Off. . |
| 0187596 | 7/1986 | European Pat. Off. . |
| 0038855 | 2/1985 | Japan . |
| 0198771 | 10/1985 | Japan . |
| 0067954 | 4/1986 | Japan . |
| 0081752 | 4/1987 | Japan . |

OTHER PUBLICATIONS

J. D. Plummer, "Process Physics, Implications for Manufacturing of Submicron Silicon Devices", Solid State Technology, Mar. 86, pp. 61-66.

Primary Examiner—Tom Thomas
Attorney, Agent, or Firm—Oblon, Spivak, McClelland, Maier & Neustadt

[57] ABSTRACT

A dynamic random access memory is disclosed which includes a trench type memory cell having a transistor formed in a semiconductive substrate, and a capacitor arranged in a trench formed in the substrate and having a trench structure. The capacitor includes an impurity-doped semiconductive layer formed on the substrate so as to surround the trench and having a conductivity type opposite to that of the substrate, a first capacitor electrode formed in the trench, and a second capacitor electrode having a portion insulatively stacked with said first capacitor electrode in the trench.

13 Claims, 16 Drawing Sheets

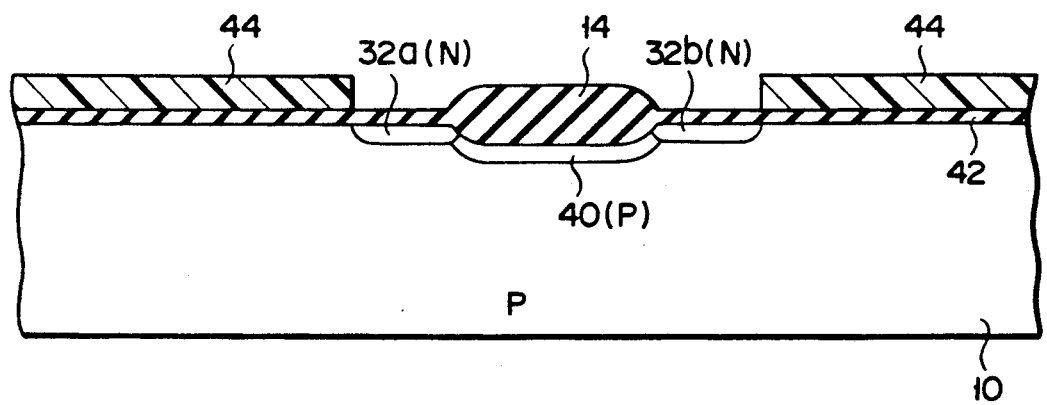
F I G. 3A
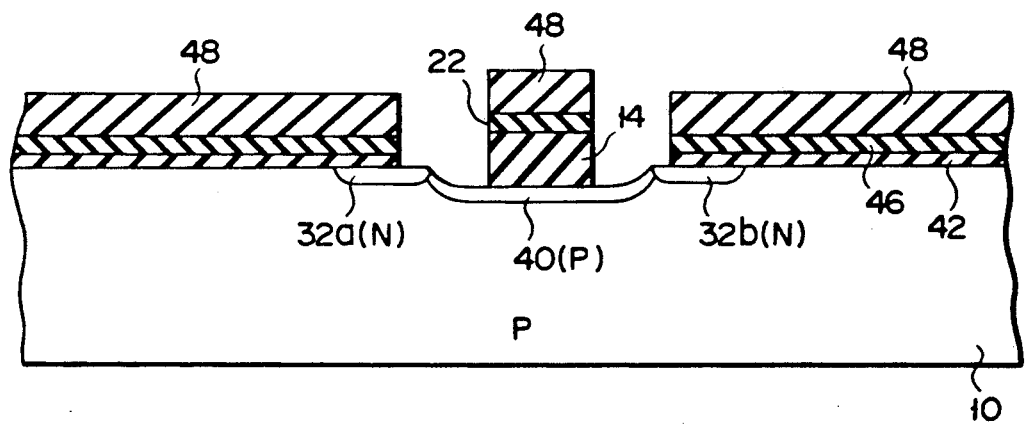
F I G. 3B
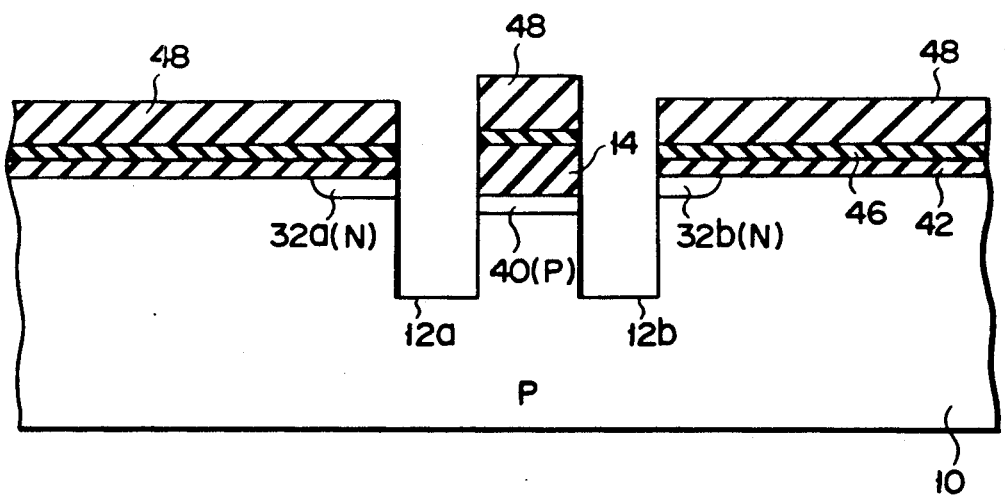
F I G. 3C

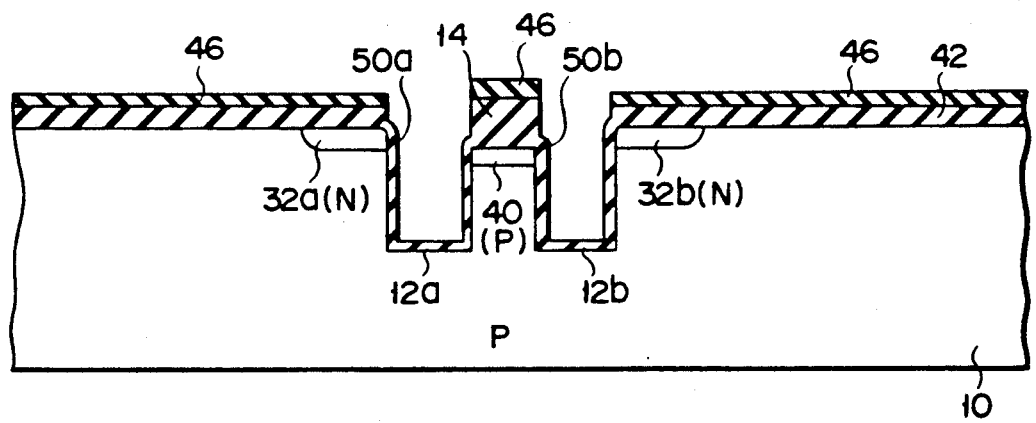
F I G. 3D
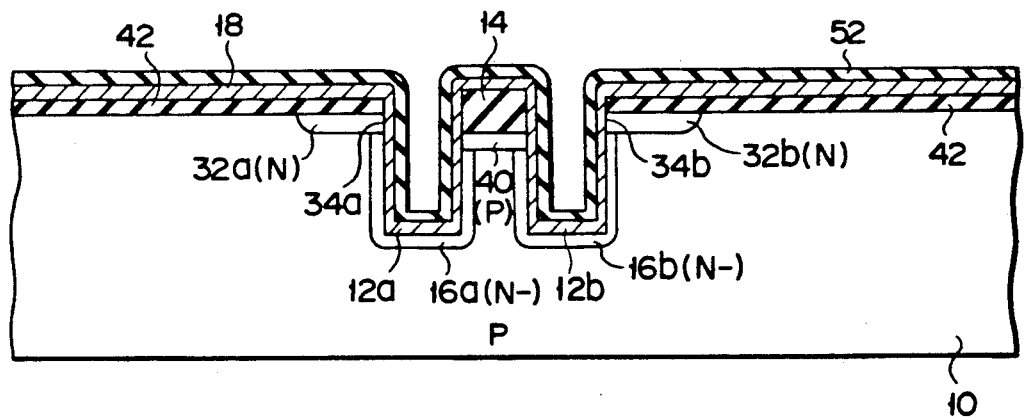
F I G. 3E
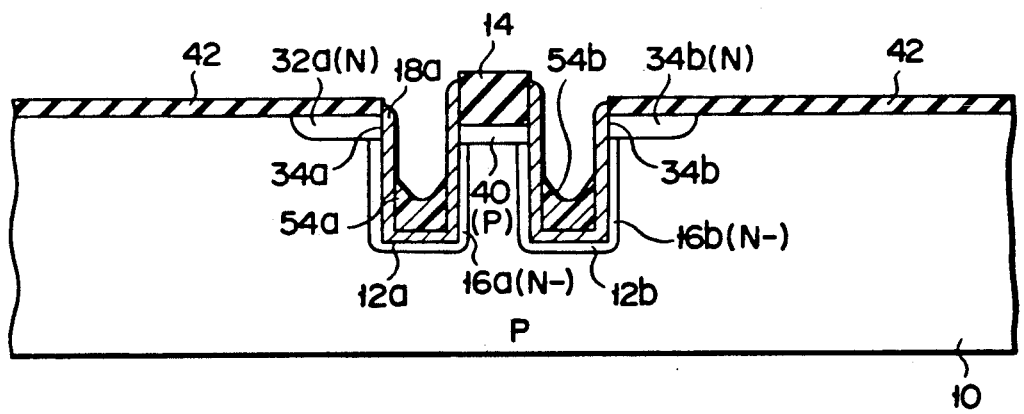
F I G 3F

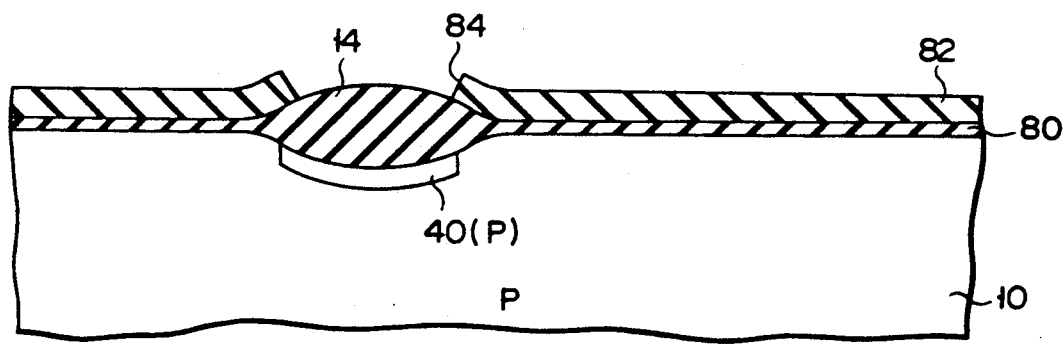
F I G. 10A
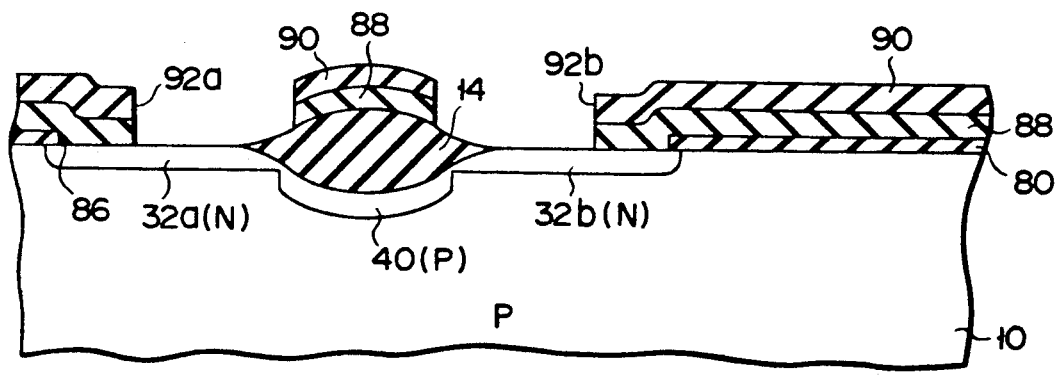
F I G. 10B
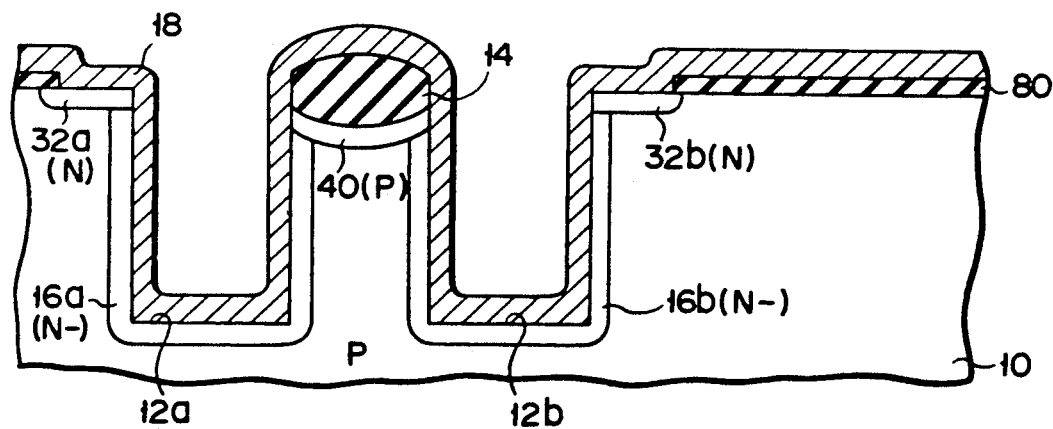
F I G. 10C

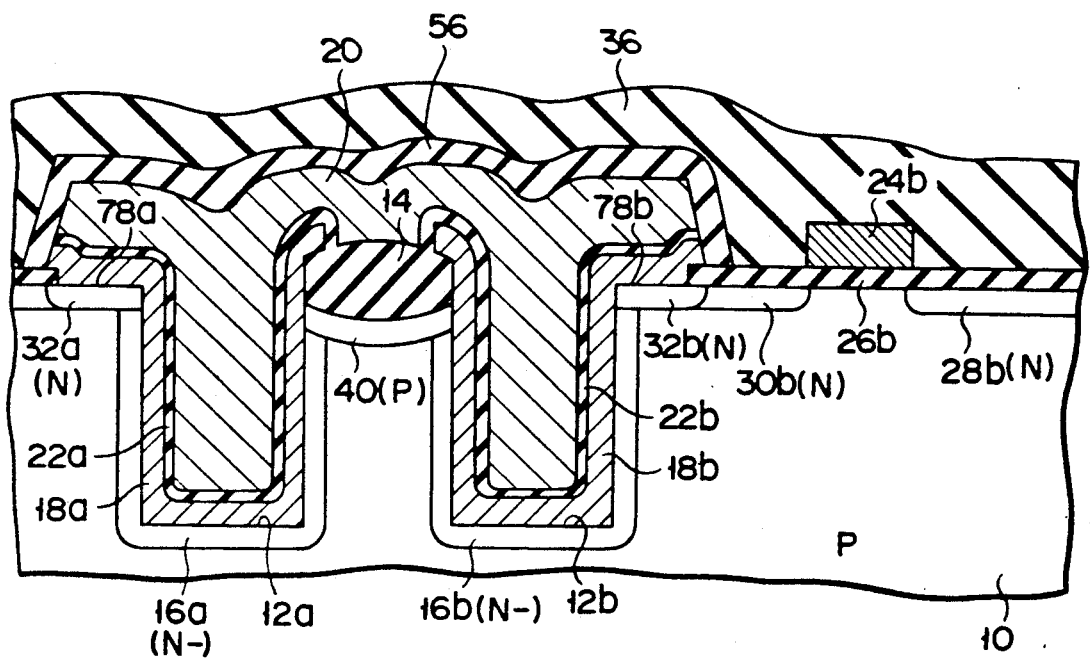
F I G. 10F
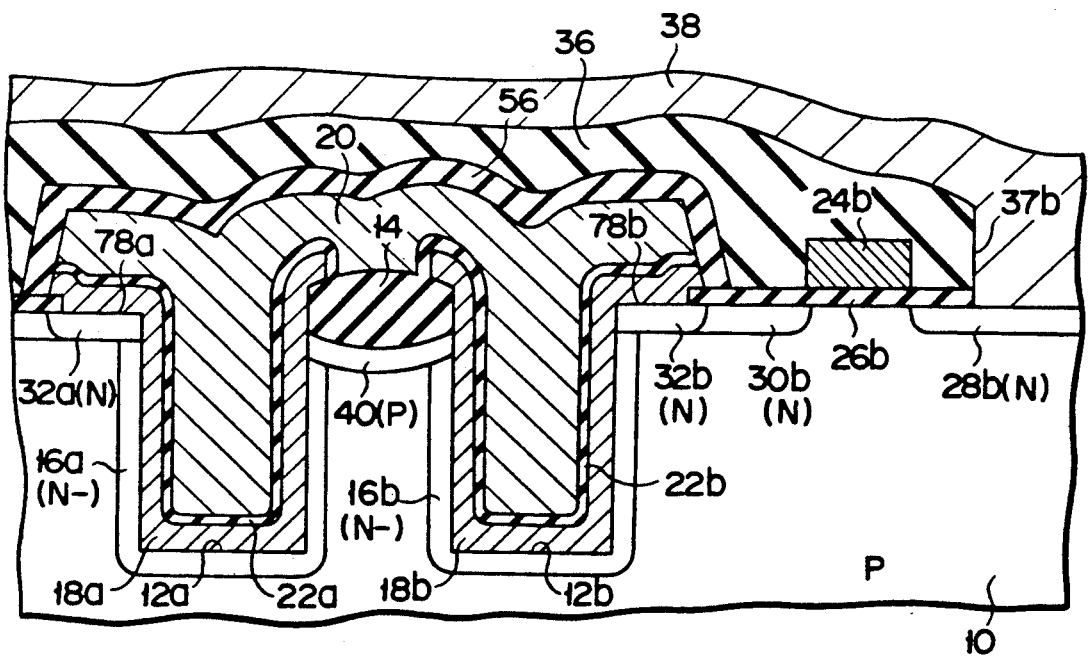
F I G. 10G

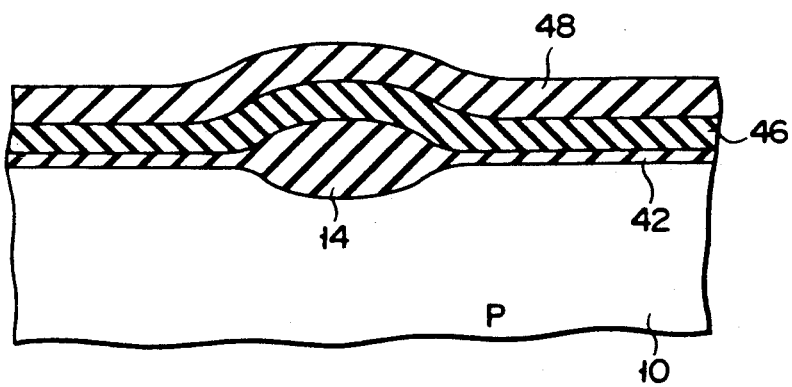
F I G. 14A
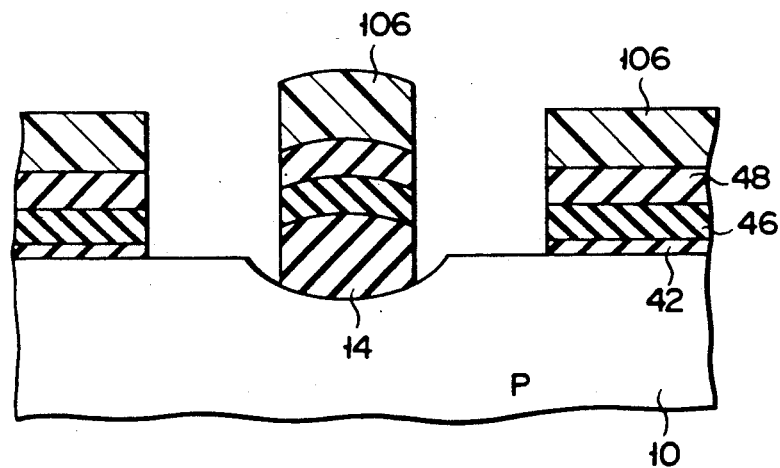
F I G. 14B
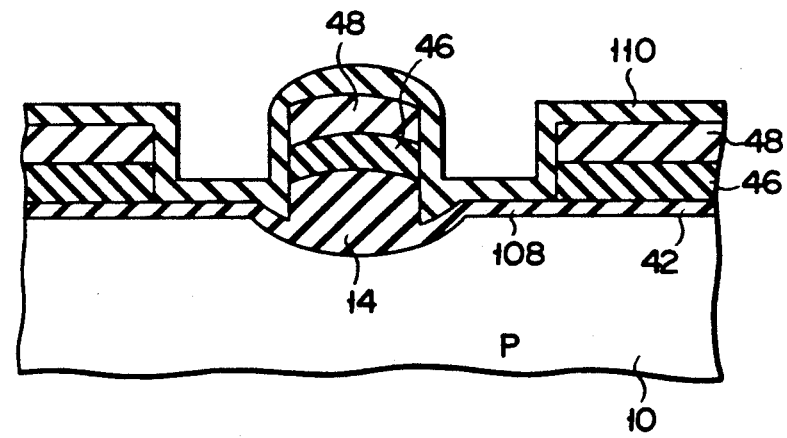
F I G. 14C

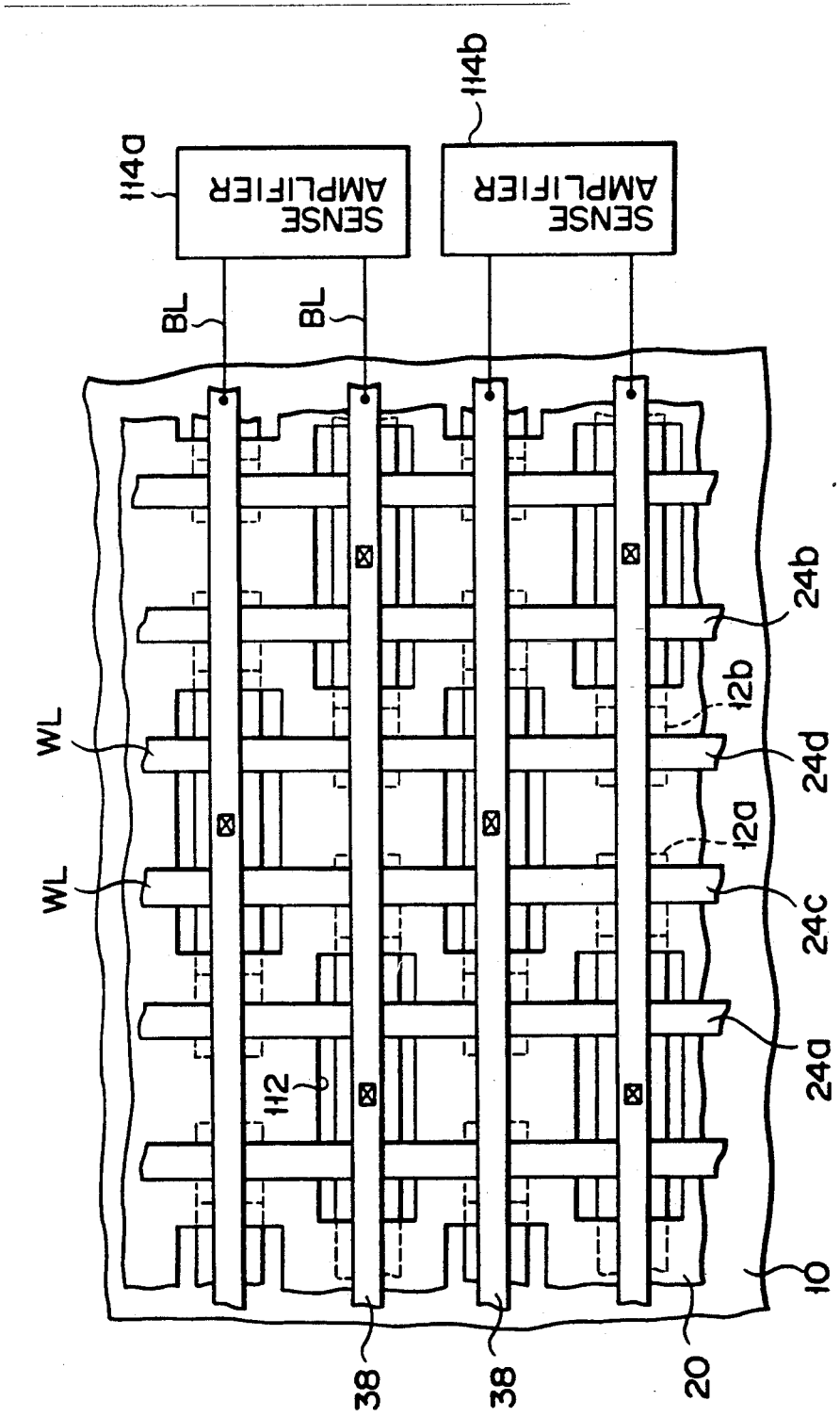
F I G. 15

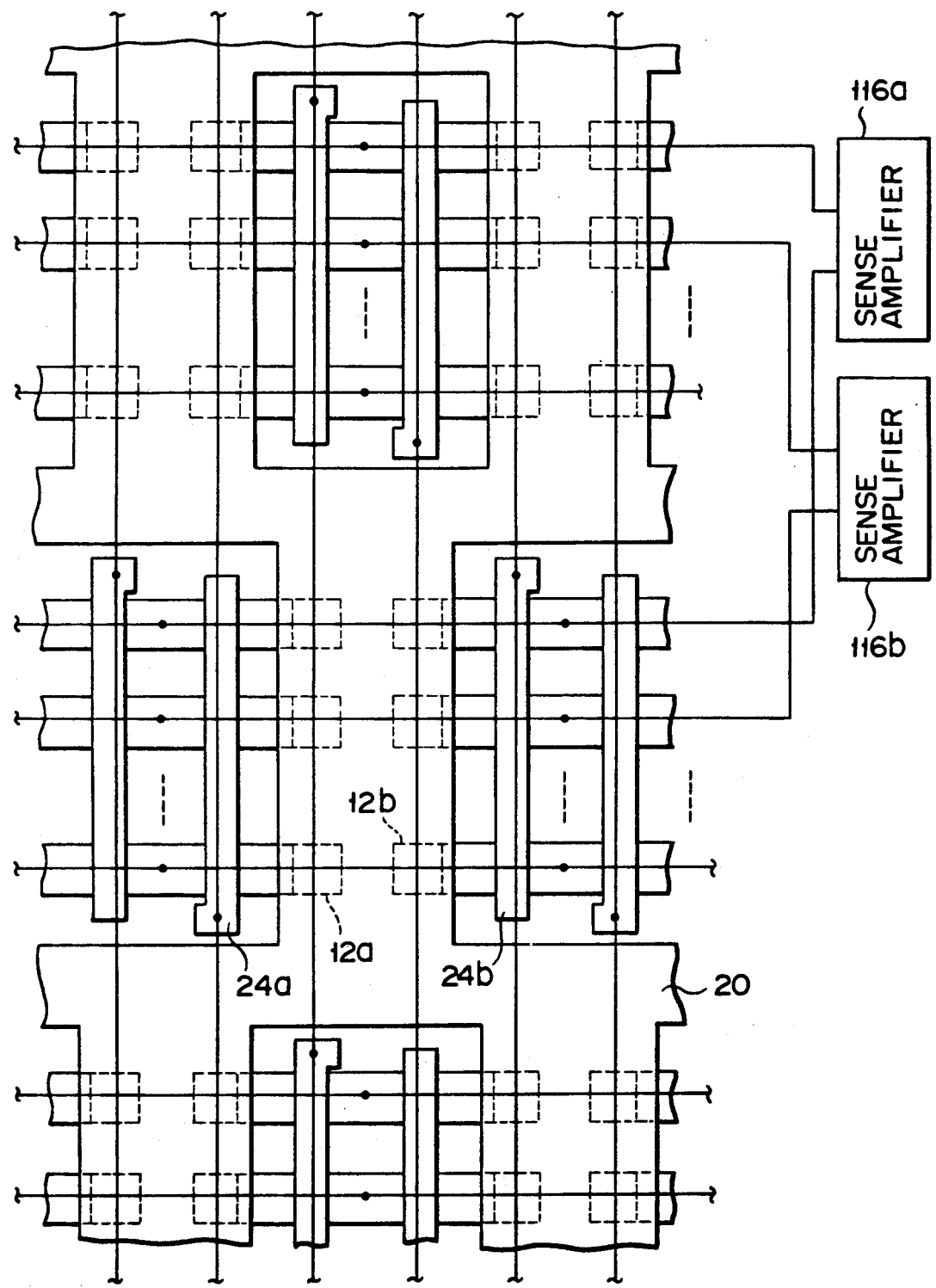
F I G. 16

METHOD OF MAKING TRENCH TYPE DYNAMIC RANDOM ACCESS MEMORY DEVICE

This application is a continuation of application Ser. No. 07/216,398, filed on July 8, 1988, now abandoned.

Background of the Invention

1. Field of the Invention

The present invention relates to a semiconductor memory device and, more particularly, to a dynamic random access memory, in which each cell has a trench type capacitor structure, and a manufacturing method thereof.

2. Description of the Related Art

With the increasing need for high performance and reliability of advanced digital systems, the technique for highly integrated dynamic random access memories (to be referred to as "dRAMs" hereinafter) becomes indispensable. In such a dRAM, in order to arrange a larger number of memory cells on a chip substrate with a limited area, a "trench capacitor" structure is employed, wherein each cell has a cell capacitor provided in a groove or trench formed in a substrate surface. A cell electrode layer is buried in the trench so as to oppose an inner wall of the trench. Therefore, the amount of charge carriers which can be stored in the cell capacitor is increased, and hence erroneous reading of memory data contents and destruction of memory storage contents caused by radiation such as x-ray can be suppressed.

According to a known highly-integrated trench capacitor type dRAM, in each trench, an impurity of the opposite conductivity type is doped by diffusion into a chip substrate to form a lightly-doped semiconductor layer surrounding the trench. A conductive layer serving as a capacitor electrode is insulatively disposed above the substrate so as to oppose the semiconductor layer, thereby constituting a cell capacitor in the trench. In each trench, charge carriers are stored in the semiconductor layer insulatively opposing the capacitor electrode.

According to such a cell structure, however, the punch-through phenomenon tends to occur as the integration density of a dRAM is increased. More specifically, a distance between adjacent trenches is decreased as the integration density of the dRAM is further increased. With a decrease in distance between the trenches, the "punch-through" phenomenon tends to occur, i.e., data charge carriers stored in cells tend to leak through the substrate. The "punch-through" phenomenon brings about destruction of the data storage contents in the dRAM. Thus, a serious problem of interfering with an increase in integration density of the dRAM remains.

In the highly-integrated dRAM, in order to suppress or prevent such a "punch-through" phenomenon, the distance between the trench capacitors of neighboring cells may be increased by decreasing the doping depth (diffusion depth) of the semiconductor layer in the trench. However, it is very difficult to decrease the diffusion depth to be less than a given value (e.g., 0.2 $\mu$m) when a semiconductor layer is formed using an existing solid-phase diffusion technique.

In order to prevent the above-described "punch-through" phenomenon, a specific multi-layered capacitor structure for a dRAM is proposed in Japanese Patent Disclosure (Kokai) No. 61-67954, wherein first and second capacitor cell electrodes are insulatively formed in a cell trench. In this structure, a lightly-doped semiconductor layer surrounding the trench is omitted. However, numerous crystal defects are inherrently present in an interface between a substrate and an insulative layer sandwiched by the substrate and the first capacitor electrode. If a depletion layer expands from a source diffusion layer (or a drain diffusion layer) of a metal oxide semiconductor field effect transistor (MOSFET) functioning as a cell transistor into the substrate while including the above-described defects, the noise resistance characteristics such as a signal-to-noise ratio of the dRAM is greatly degraded.

SUMMARY OF THE INVENTION

It is therefore an object of the present invention to provide a new and improved trench capacitor type random access memory device of high integration density and a manufacturing method thereof.

In accordance with the above object, the present invention is addressed to a specific semiconductor memory device which comprises a semiconductive substrate and memory cells formed in the substrate. The memory cells include a certain memory cell which has a transistor formed in the substrate, and a capacitor having a trench structure, which is formed in a trench formed in the substrate. The capacitor includes an impurity-doped semiconductive layer formed on the substrate so as to surround the trench and has a conductivity type opposite to that of the substrate, a first capacitor electrode formed in the trench, and a second capacitor electrode having a portion insulatively stacked with the first capacitor electrode in the trench.

According to a method of manufacturing the above-described semiconductor memory device, a trench is formed in an upper surface layer of a substrate. This trench has an inner side wall, and the substrate has a top surface portion continuous with the inner side wall of the trench. A first conductive layer is formed on the substrate so as to directly bond to the inner side wall of the trench. An impurity is doped in the substrate through the first conductive layer to form a semiconductive conductive layer, which is formed on the substrate so as to surround the trench and has a conductivity type opposite to that of the substrate. The semiconductive layer is brought into electrical contact with one of the source and drain diffusion regions of the transistor. The first conductive layer is etched to form a first capacitor electrode in the trench. A second conductive layer is insulatively formed above the first capacitor electrode. The second conductive layer is etched to form a second capacitor electrode having a portion insulatively stacked with the first capacitor electrode in the trench. A gate electrode of the transistor is insulatively formed above the substrate at a position adjacent to the trench. An impurity is doped in the substrate using this gate electrode as a mask to form first and second diffusion layers. The first and second diffusion layers are formed in the substrate, have a conductivity type opposite to that of the substrate, and function as a source and a drain of the transistor. One of the first and second diffusion layers is brought into electrical contact with first capacitor electrode.

The present invention, and its objects and advantages will become apparent from a detailed description of preferred embodiments presented below.

BRIEF DESCRIPTION OF THE DRAWINGS

In the detailed description of preferred embodiments of the invention presented below, reference is made to the accompanying drawings of which:

FIGS. 3A to 3I are diagrams illustrating, in cross-section, some of the major steps in the manufacturing process in accordance with one embodiment of the present invention;

FIGS. 10A to 10G are diagrams illustrating, in cross-section, some of the major steps in the manufacturing process in accordance with still another embodiment of the present invention;

FIGS. 14A to 14F are diagrams illustrating, in cross-section, some of the major steps in the manufacturing process in accordance with still another embodiment of the present invention;

FIG. 15 is a diagram illustrating a plan view of a main part of a dRAM having a trench capacitor structure according to still another embodiment of the present invention; and FIG. 16 is a diagram illustrating a plan view of a main part of a dRAM having a trench capacitor structure according to still another embodiment of the present invention.

DETAILED DESCRIPTION OF THE PREFERRED EMBODIMENTS

Figure 1:
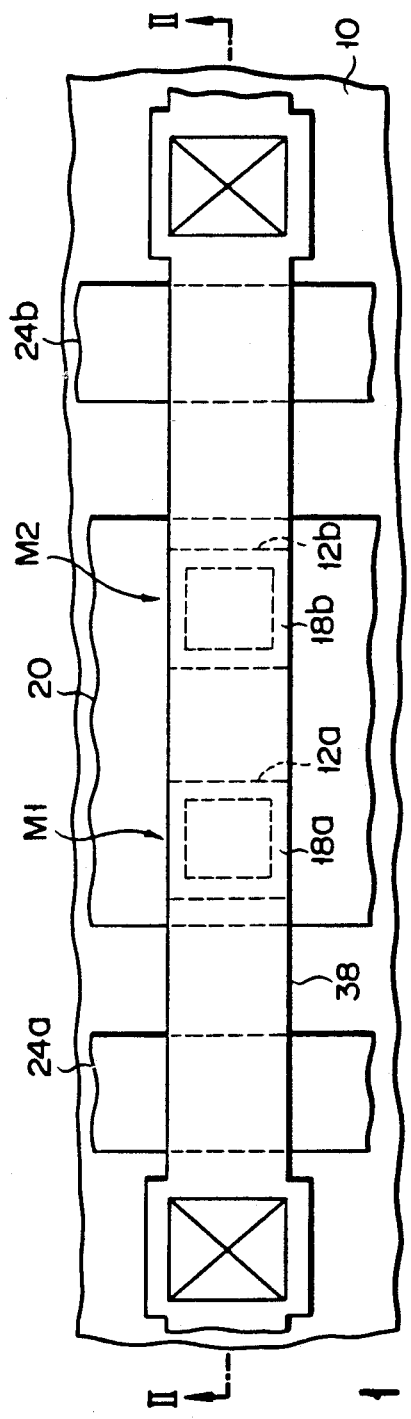
FIG. 1 is a diagram illustrating a plan view of a main part of a dynamic random access memory (dRAM) having a trench capacitor structure in accordance with one embodiment of the present invention.

Referring now to FIG. 1, a dRAM according to an embodiment of the present invention includes two adjacent memory cells M1 and M2 (equivalent to two bits), which are formed in the top surface layer of a semiconductor substrate having a p conductivity type such as a silicon substrate (to be referred to as a "p-type Si substrate" or more simply as a "substrate" hereinafter) 10. Trenches 12a and 12b are respectively formed in memory cell regions isolated from each other by element isolating insulative film 14 in p-type Si substrate 10. Lightly-doped $n^-$-type semiconductor layers 16a and 16b are respectively formed in the overall inner walls of trenches 12.

First capacitor electrodes 18a and 18b are independently buried in the respective memory cells. First capacitor electrode 18a of memory cell M1 is formed in trench 12a so as to be in direct contact with the corresponding $n^-$-type layer 16a. First capacitor electrode 18b of memory cell M2 is formed in trench 12b so as to be in direct contact with the corresponding $n^-$-type layer 16b. $N^-$-type layers 16 may be polysilicon films. Each first capacitor electrode 18 is locally buried in only a corresponding trench 12, and hence does not extend to the outside thereof.

Second capacitor electrode 20 consisting of a second polysilicon film is buried in trenches 12a and 12b so as to be electrically insulated from first capacitor electrode 18 by insulative films 22a and 22b. In this embodiment, capacitor insulative films 22a and 22b are oxide films which are formed by thermally oxidizing the upper surface layer of first capacitor electrode 18. Second capacitor electrode 20 is commonly formed in memory cells included in neighboring cell arrays, thereby providing a so-called "cell plate" structure.

Gate electrodes 24a and 24b consisting of a third polysilicon film are insulatively deposited on gate insulative films 26a and 26b above surface positions adjacent to the capacitor regions of substrate 10. As shown in FIG. 1, gate electrodes 24a and 24b extend to be substantially parallel to second capacitor electrode 20. Each of gate electrodes 24a and 24b is continuously formed in one direction of a memory cell matrix, and gate electrodes 24a and 24b serve as word lines, respectively.

N-type layers 28a and 30a are formed in substrate 10 so as to be self-aligned with one gate electrode 24a, and serve as the source and drain of cell transistor (MOS transistor) Q1. N-type layers 28b and 30b are formed in substrate 10 so as to be self-aligned with the other gate electrode 24b, and serve as the source and drain of cell transistor (MOS transistor) Q2. N-type layers 32a and 32b are additionally formed in substrate 10 so as to partially overlap n-type layers 30a and 30b, and abut against the corresponding side walls of trenches 12a and 12b. Each n-type layer 32 functions as part of a source or drain diffusion layer of cell transistor Q. Each of first capacitor electrodes 18a and 18b is in contact with n-type layer 32 on upper side wall 34 of corresponding trench 12, so that first capacitor electrode 18 is electrically connected to one of the source and drain of the MOS transistor.

CVD insulative film 36 is formed above substrate 10 so as to cover the above-described trench type capacitors and the MOS transistors. Contact holes 37a and 37b are formed in CVD insulative film 36. Al bit line 38 is connected to n-type layers 28a and 28b through contact holes 37.

Figure 3G:
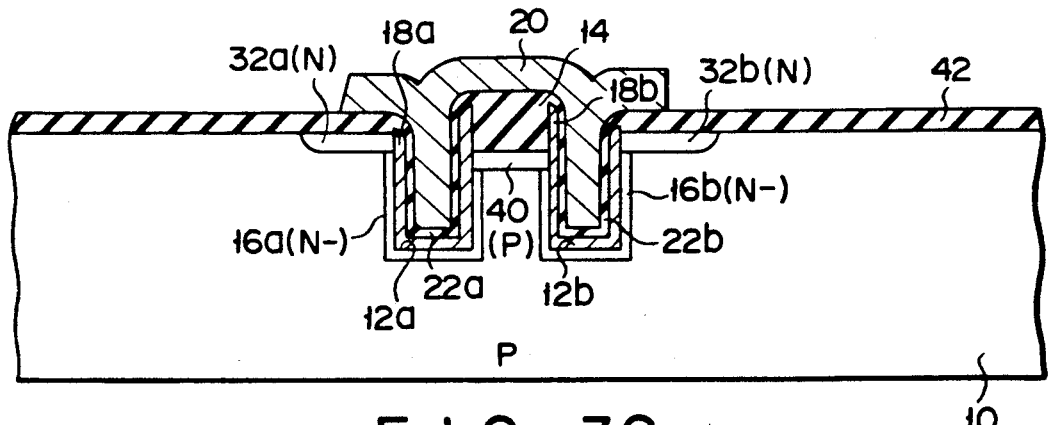
Figure 3H:
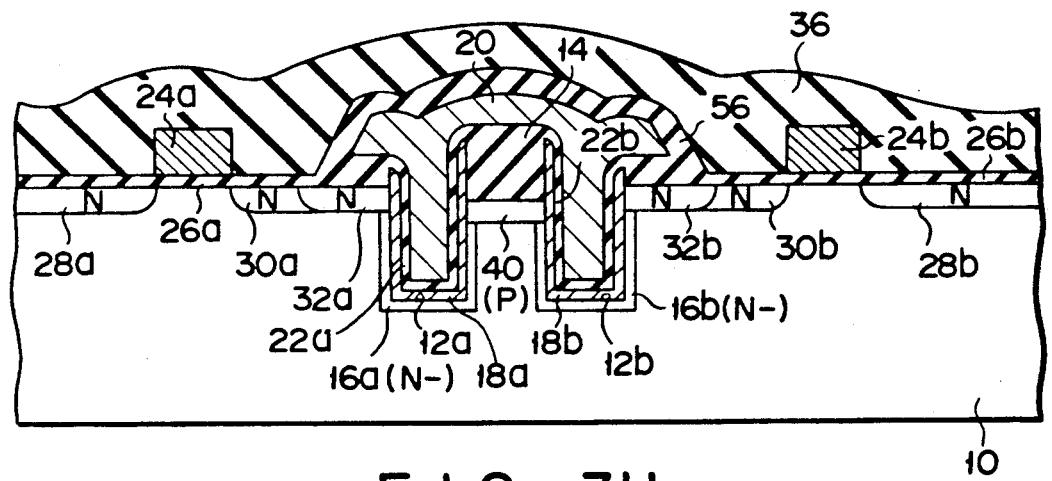

A manufacturing method of this dRAM will be described with reference to FIGS. 3A to 3I. Element isolating insulative film 14 is formed by a known method on p-type Si substrate 10 having a specific resistance of about 5 Ωm. Insulative film 14 consists of a 700-nm thick silicon film formed by selective oxidation. P-type layer 40 is formed in advance, as a channel stopper, in the region of element isolating insulative film 14. Then, oxide film 42 is formed by thermal oxidation in an element formation region to have a thickness of about 100 nm. Patterned photoresist layer 44 is deposited on oxide film 42. Arsenic (As) ions are implanted in substrate 10 using photoresist layer 44 as a mask to form n-type layers 32a and 32b serving as parts of the source and drain diffusion layers, as shown in FIG. 3B.

Upon removal of photoresist layer 44, silicon nitride film 46 is deposited by the CVD method on the entire surface of the above-described structure to have a thickness of about 100 nm, as shown in FIG. 3B. Silicon oxide film 48 is deposited on the resultant structure to have a thickness of about 500 nm. Stacked layers 42, 46, and 48 are etched by reactive ion etching (RIE) using a photoresist film pattern (not shown) having windows at trench formation regions to partially expose the substrate surface. Exposed substrate 10 is subjected to RIE process using oxide and nitride films 48 and 46 as masks to form trenches 12a and 12b in the respective memory cell regions, as shown in FIG. 3C. The depth of trench 12 is set to be about 5 μm.

Thereafter, the exposed inner walls of trenches 12a and 12b are oxidized in a steam atmosphere at 850° C. to form oxide films 50a and 50b each having a thickness of about 10 nm. Oxide films 50 are formed to eliminate mainly etching damage to the inner wall when the trenches are formed. Nitride film 46 is removed using a gas containing $CF_4$. After oxide film 50 on the inner walls of trenches 12a and 12b is removed by etching, first polysilicon film 18 is deposited on the entire surface of the resultant structure to have a thickness of about 100 nm, as shown in FIG. 3E. AsSG film 52 having a concentration of AS $1 \times 10^{20}/cm^3$ is deposited on the entire surface of polysilicon film 18. In this state, the resultant structure is annealed at 950° C. for 30 minutes to diffuse As ions of AsSG film 52 in polysilicon film 18. By utilizing this As diffusion from polysilicon film 18, $n^-$-type layers 16a and 16b are respectively formed on the inner walls of trenches 12a and 12b, as shown in FIG. 3E.

After AsSG film 52 is removed, photoresist film 54 is coated on the entire surface of the resultant structure. Then, the entire surface is exposed and developed to obtain photoresist layer portions 54a and 54b left on only bottom portions of trenches 12a and 12b, as shown in FIG. 3F. The step of leaving photoresist layers 54 on only the bottom portions of trenches 12a and 12b may be performed by the reactive ion etching method using $O_2$ gas. First polysilicon film 18 is etched by reactive ion etching using photoresist layer portions 54 as masks. With this process, first polysilicon film 18 is formed along the inner walls of trenches 12 to form first capacitor electrodes 18a and 18b which do not extend outside trenches 12.

With the above process, first capacitor electrode 18 is brought into contact with the substantially entire surface of $n^-$-type layer 16, and hence electrically connected thereto. In this case, the diffusion depth of $n^-$-type layer 16 is determined by an impurity concentration of a diffusion source, and a temperature and a time of the annealing process. In consideration of these conditions, the diffusion depth is set to be 0.2 μm or less, or more preferably, to be 0.1 μm or less. In addition, first capacitor electrodes 18a and 18b are electrically connected to n-type layers 32a and 32b, which are formed in upper potions of the trench side walls, respectively. It should be noted that oblique ion implantation at an angle of, e.g., 15° is effective to decease the contact resistances of the upper portions of trenches 12 of first capacitor electrodes 18.

Upon removal of photoresist layer portions 54, the surfaces of first capacitor electrodes 18a and 18b are cleaned. Then, oxide films each having a thickness of about 10 nm are formed by thermal oxidation as capacitor insulative films 22a and 22b. A second polysilicon film doped with an n-type impurity is deposited on the entire surface of the resultant structure. This polysilicon film is patterned to form second capacitor electrode 20 serving as a cell plate (see FIG. 3G). Note that in addition to an oxide film, a stacked film of a silicon nitride film and an oxide, or a multi-layered film thereof may be used as capacitor insulative films 22. In this case, if the nitride film is formed by the CVD method, uniform films can be obtained on the side walls of the trenches, thereby improving reliability of the capacitor insulative films. In patterning of second capacitor electrode 20, both the edges of second capacitor electrode 20 are tapered at 45° by the chemical dry etching (CDE) using $CF_4$ gas. This process is effective to prevent other materials from being left on the side wall of second capacitor electrode 20 in the successive process.

Figure 2:
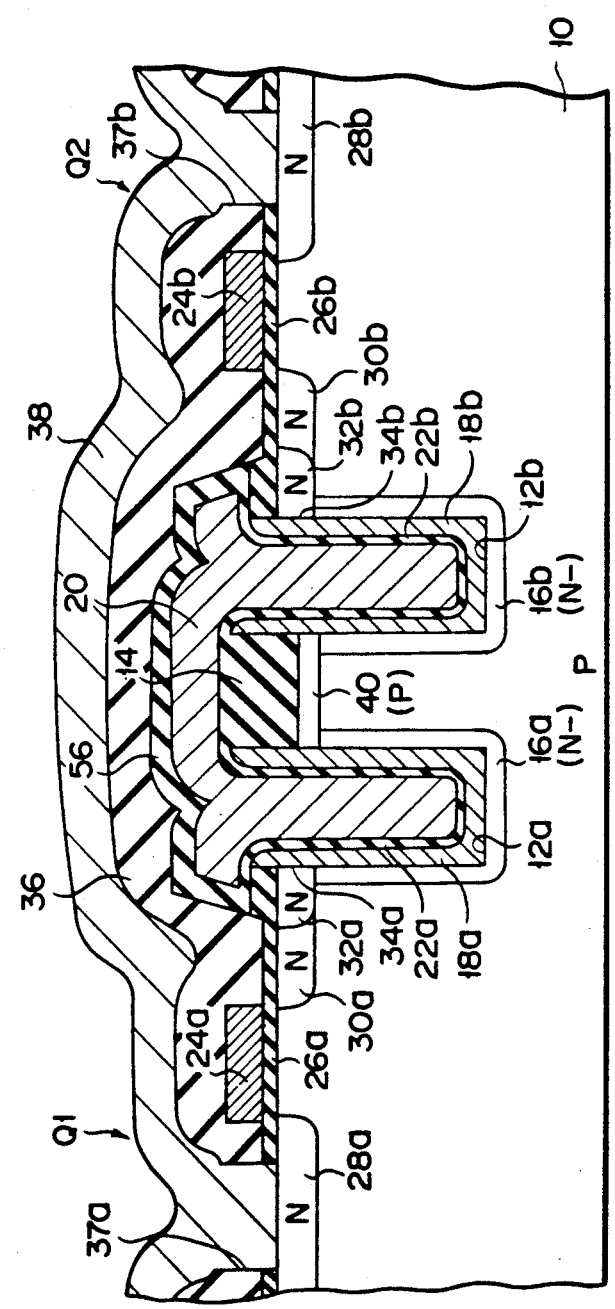
FIG. 2 is a diagram illustrating a sectional structure of the dRAM in FIG. 1 taken along the line II—II thereof.

Subsequently, the resultant structure is thermally oxidized at 850° C. in a steam atmosphere to form oxide film 56 having a thickness of about 200 nm on the surface of second capacitor electrode. An oxide film in the MOS transistor regions is removed to expose the substrate surface. Gate insulative films 26a and 26b consisting of a thermal oxide film having a thickness of about 15 nm are then formed, as shown in FIG. 2H. Then, gate electrodes 24a and 24b serving as word lines are formed by depositing and patterning a third polysilicon film. N-type layers 28 and 30 as source and drain diffusion layers are formed by implanting, e.g., phosphorus (P) ions in substrate 10 using gate electrodes 24. Part of n-type layer 30 overlaps n-type layer 32 which has been formed in advance, and hence is also electrically connected to $n^-$-type layers 16 on the inner walls of trenches 12a and 12b. After this process, $n^+$-type diffusion layer formation and the like (not shown) are performed to form an LDD structure on a peripheral circuit portion. Then, CVD insulative film 36 is deposited on the entire surface of the resultant structure (see FIG. 3H).

Figure 3I:
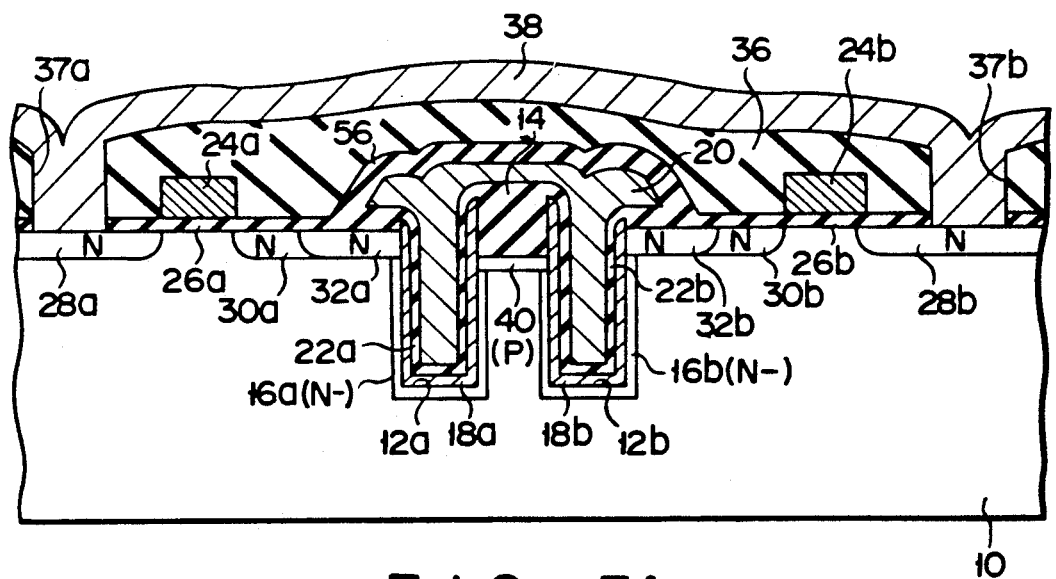

Finally, as shown in FIG. 3I, contact holes 37a and 37b are formed. Bit line 38 is formed by depositing and patterning an Al film. Bit line 38 may be formed using a multi-layered structure of a polysilicon film and a molybdenum silicide film or the like in place of an Al film.

Figure 4:
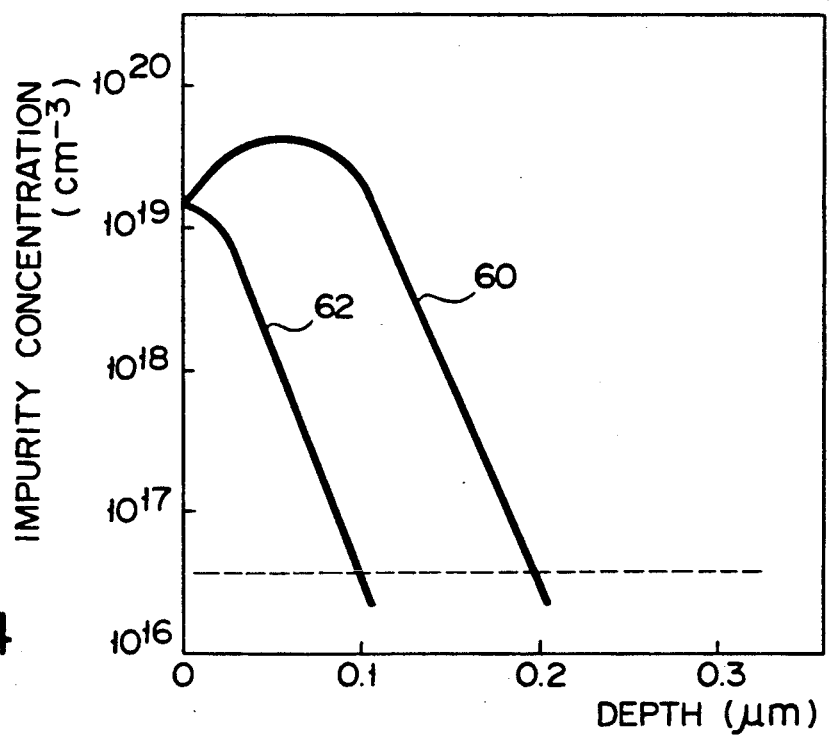
FIG. 4 is a graph, wherein a diffusion depth of an $n^-$-type layer in a trench of the dRAM of the present invention is compared with that of a conventional dRAM.

In the dRAM of this embodiment, the punch-through voltage between adjacent memory cells is determined by the distance between $n^-$-type layers 16a and 16b formed on the inner walls of trenches. This punch-through voltage is higher than that in the conventional dRAM. This is because $n^-$-type layers 16 can be formed in the inner walls of trenches 12 in a lower concentration and a shallower depth than those in the conventional dRAM. FIG. 4 shows this state in comparison with the conventional dRAM. According to such a dRAM as disclosed in the introductory part of the description, an $n^-$-type layer in a trench constitutes one of the capacitor electrodes, and hence its specific resistance is not allowed to be greatly decreased. In addition, since a capacitor insulative film is formed by oxidizing the surface of this n⁻-type layer, the surface impurity concentration tends to be decreased. For these reasons, in order to form an n⁻-type layer having a surface impurity concentration of, e.g., $10^{19}/cm^3$ an impurity concentration of about $10^{20}/cm^3$ must be doped in advance at a high temperature. Therefore, as indicated by a characteristic curve designated by reference numeral 60 in the graph of FIG. 4, the diffusion depth of the n⁻-type layer inevitably becomes about 0.2 μm or more. In contrast to this, in the dRAM according to the above-described embodiment of the present invention, capacitor insulative films 22 are formed by oxidizing the surfaces of first capacitor electrodes 18, thereby preventing external impurity diffusion. Therefore, as indicated by a characteristic curve designated by reference numeral 62 in the graph of FIG. 4, it is very easy to set the diffusion depth of the n⁻-type layer to be about 0.1 μm or less by keeping the surface impurity concentration of about $10^{19}/cm^3$. In addition, since the first polysilicon layer is formed into the first capacitor electrodes, the impurity concentration of n⁻-type layer 16 need not be set to be as high as that in the conventional dRAM. For the above-described reasons, if the punch-through voltage is only required to be as high as that in the conventional dRAM, the integration density of memory cells can be increased as compared with that of the conventional dRAM. If the integration density is the same as that of the conventional dRAM, the punch-through voltage of the dRAM can be set to be higher than that of the conventional dRAM.

According to this embodiment, since capacitor insulative films 22 are obtained by oxidizing the surfaces of first capacitor electrodes 18 consisting of a polysilicon film, no problem is posed in terms of a difference in oxidation rate due to the surface orientation, thereby obtaining the capacitor insulative films having a uniform thickness. This fact contributes to an improvement in reliability of the dRAM.

In addition, according to the above-described manufacturing method of the dRAM, by forming the lightly-doped diffusion layers in the inner walls of the respective trenches utilizing solid-phase diffusion from the first capacitor electrodes, their diffusion depths can be set to be small, thereby realizing the high integration density and high reliability of the above-described dRAM. Moreover, since the capacitor insulative films can be formed upon thermal oxidation of the first capacitor electrodes, the uniformity of the capacitor insulative films can be improved, thereby realizing the high performance and reliability of the dRAM in this respect.

Figure 5A:
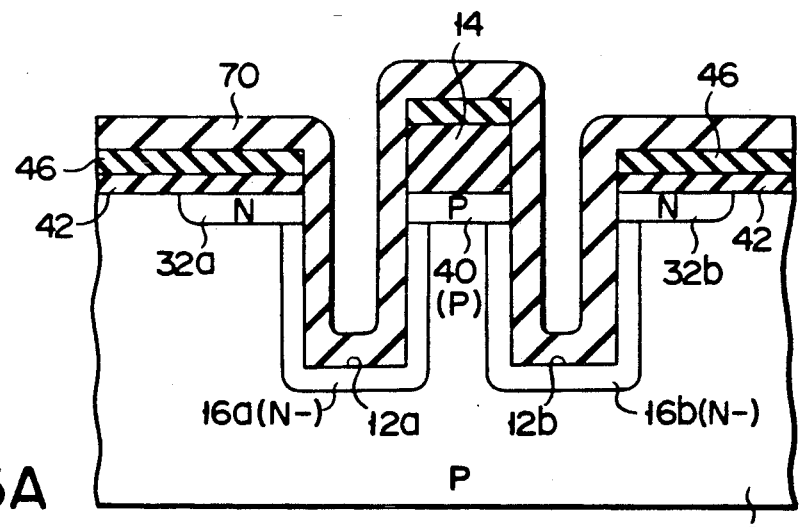
FIGS. 5A and 5B are diagrams illustrating, in cross-section, some of the major steps in manufacturing process in accordance with another embodiment of the present invention.
Figure 5B:
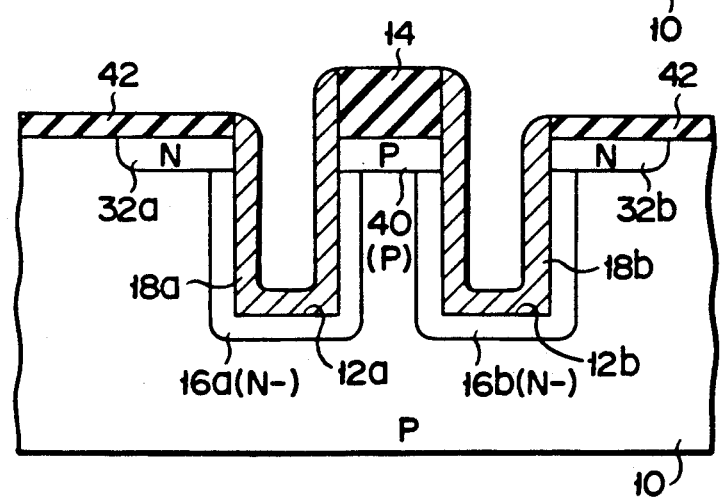

A manufacturing method of the dRAM according to another embodiment of the present invention will be described with reference to FIGS. 5A and 5B. FIGS. 5A and 5B show sectional structures of the dRAM obtained in the major steps of this manufacturing method, wherein only steps different from those in the previous embodiment are shown. The manufacturing steps shown in FIGS. 3A to 3C of the previous embodiment are the same as the corresponding steps of this embodiment. After the step in FIG. 3C, oxide film 48 is removed. As shown in FIG. 5A, AsSG film 70 is deposited on the entire surface of the resultant structure. By utilizing solid-phase diffusion from AsSG film 70 at a low temperature, shallow n⁻-type layers 16 are formed on the inner walls of trenches 12a and 12b to have a thickness of about 0.05 μm each. Subsequently, AsSG film 70 is removed, and first capacitor electrodes 18a and 18b consisting of a first polysilicon film are buried/formed in trenches 12a and 12b, respectively. The successive manufacturing steps are the same as those in the previous embodiment, and hence a description thereof will be omitted.

In this embodiment, the same effects as those in the previous embodiment can be obtained. That is, even when the AsSG film is used as a solid-phase diffusion source, since all the successive capacitor insulative film formation and other annealing steps can be performed at about 850° to 900° C., the shallow n⁻-type layer can be kept shallow. In addition, the capacitor insulative films having excellent uniformity can be obtained using the thermal oxide film of the polysilicon film.

Several modifications of the above-described embodiments will be described with reference to FIGS. 6 to 9. These drawings basically correspond to the sectional view in FIG. 2.

Figure 6:
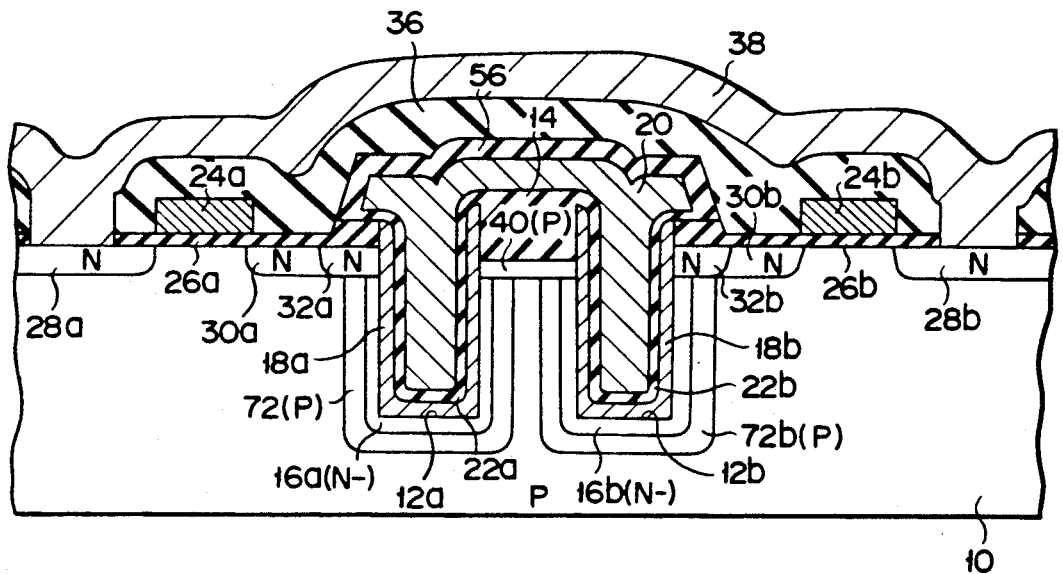
FIG. 6 is a diagram illustrating a main sectional structure of a modification of the dRAM illustrated in FIGS. 1 and 2.

A modified dRAM in FIG. 6 is featured in that p-type layers 72a and 72b are added so as to surround n⁻-type layers 16a and 16b of trenches 12a and 12b. Each of p-type layers 72 has an impurity concentration of about $1 \times 10^{17}/cm^3$. Several methods may be employed to form p-type layers 72, e.g., a method of depositing a BSG film before or after the formation of n⁻-type layer 16 and using solid-phase diffusion therefrom, a method of using solid-phase diffusion of boron (B) from a polysilicon film containing B, and a method of using a BAsSG film containing both B and arsenic (As) and forming p-type layers 72 simultaneously with n⁻-type layers 16. According to the structure of this modification, since expansion of a depletion layer from n⁻-type layers 16 can be further suppressed, the punch-through voltage can be further increased. In addition, resistance to a soft error caused by incidence of x-rays can be improved.

Figure 7:
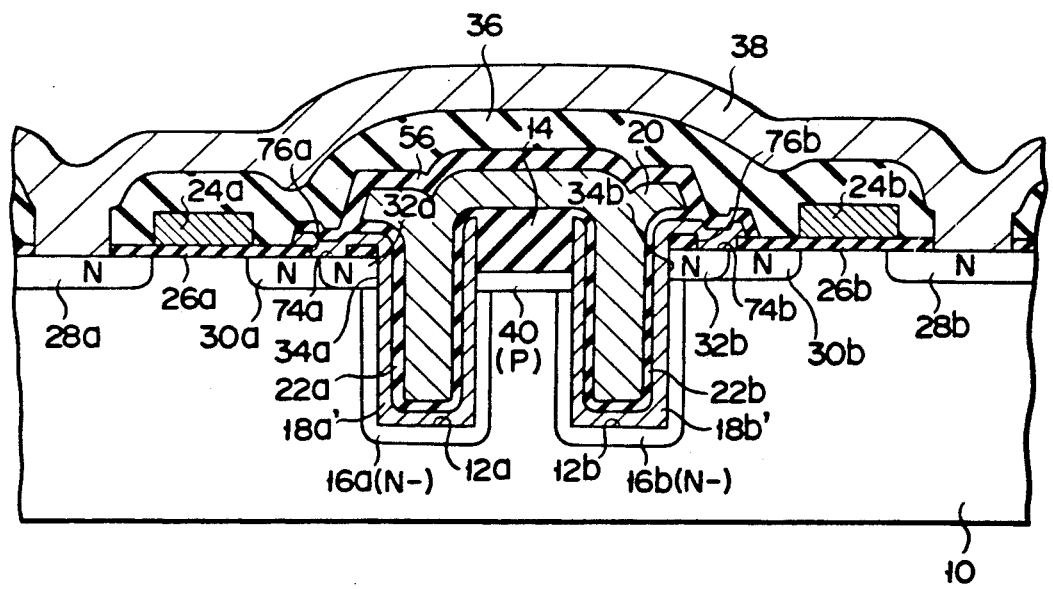
FIG. 7 is a diagram illustrating a main sectional structure of another modification of the dRAM illustrated in FIGS. 1 and 2.

According to the modified dRAM in FIG. 7, first capacitor electrodes 18a and 18b are not completely confined in trenches 12a and 12b, but a portion of each capacitor electrode extends outside trench 12. Since the extended portion of capacitor electrode 18' covers contact hole 76a (76b) formed in insulative layer 26, capacitor electrode 18 is in contact with top surface 74a (74b) of diffusion layer 30 or 32 of a corresponding MOS transistor. With this arrangement, the contact resistance between first capacitor electrode 18' and source and drain diffusion layers 30 and 32 can be further reduced.

Figure 8:
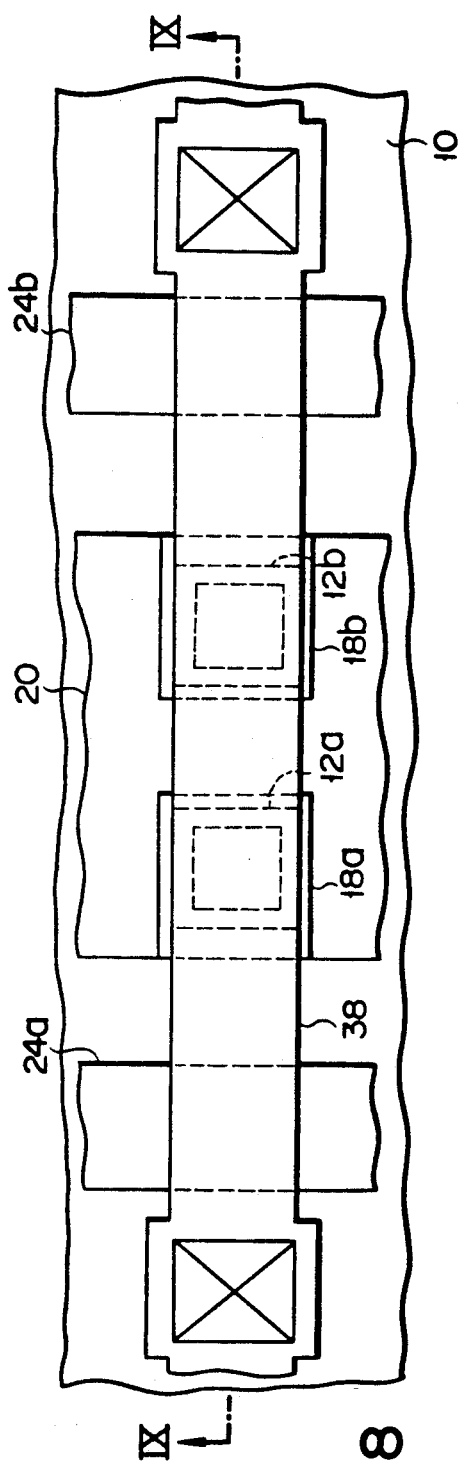
FIG. 8 is a diagram illustrating a main sectional structure of still another modification of the dRAM illustrated in FIGS. 1 and 2.
Figure 9:
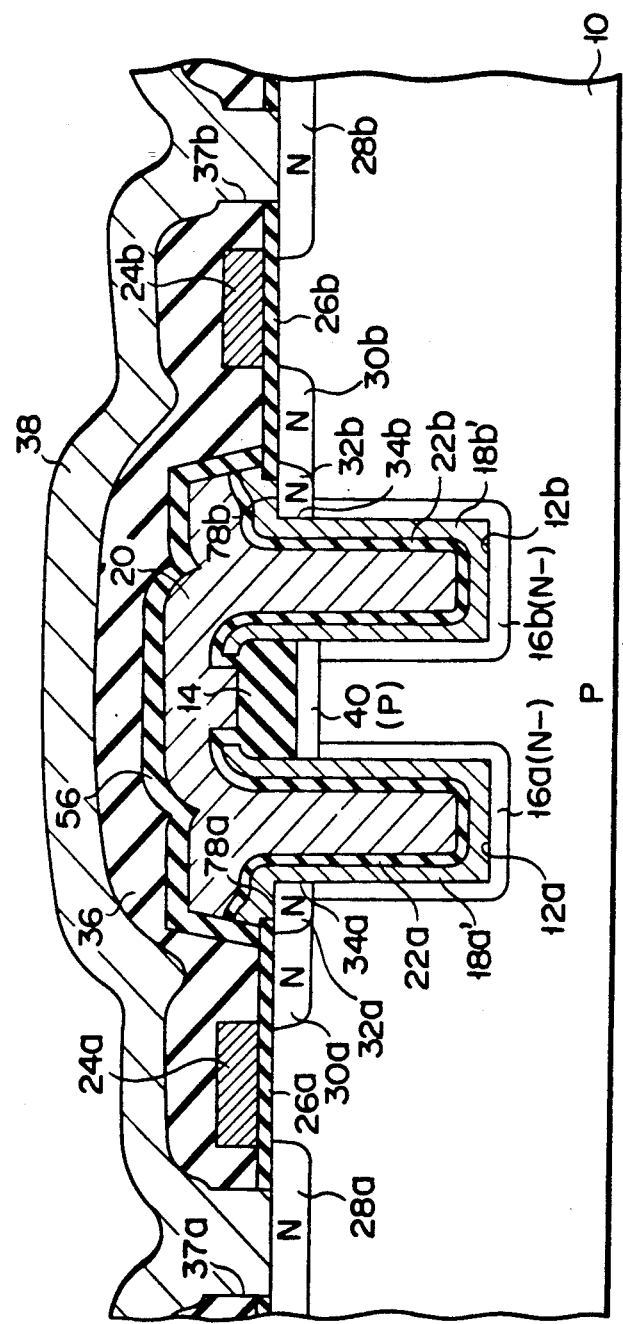
FIG. 9 is a diagram illustrating a sectional structure of the dRAM in FIG. 8 taken along the line IX—IX thereof.

According to the modified dRAM in FIGS. 8 and 9, insulative layers 26a and 26b are respectively cut at areas near the flat openings of corresponding trenches 12a and 12b. With this arrangement, top surfaces 78a and 78b of diffusion layers 32a and 32b are exposed. The extended portions of capacitor electrodes 18a' and 18b' are directly bonded to the exposed surfaces of diffusion layers 32, as shown in FIG. 9. Therefore, the contact resistance between first capacitor electrode 18, and source and drain diffusion layers 30 and 32 can be further reduced.

Figure 10D:
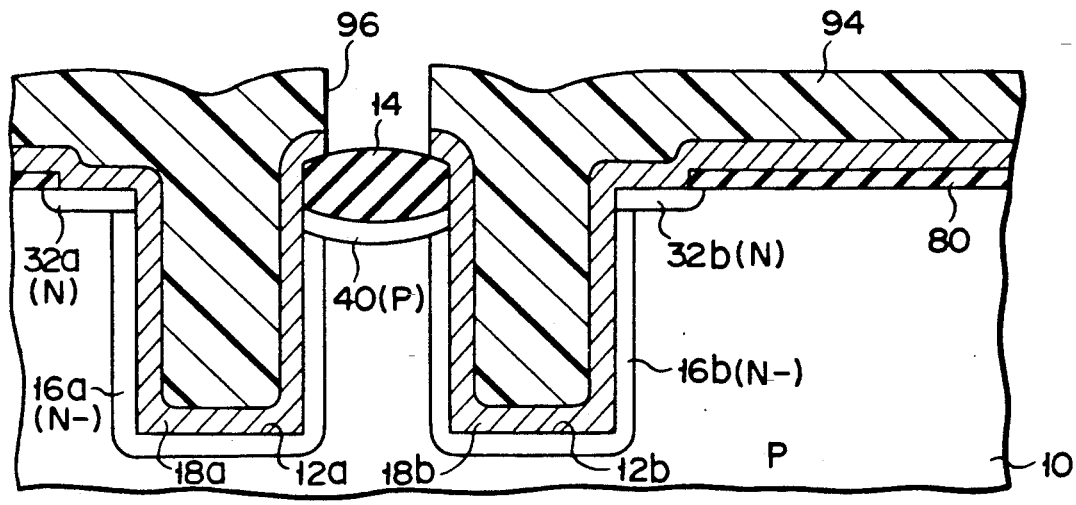

A manufacturing method of the dRAM in FIGS. 8 and 9 will be described with reference to FIGS. 10A to 10G. As shown in FIG. 10A, buffer thermal oxide film 80 and silicon nitride film 82 are deposited on Si substrate 10 having a specific resistance of 5 Ωcm and the crystal plane (100). Silicon nitride film 82 is subjected to patterning to form opening 84 therein. Element isolating insulative film 14 is then formed by a known selective oxidation method, as shown in FIG. 10A. Element isolating insulative film 14 has a thickness of about 700 nm. Prior to formation of element isolating insulative film 14, boron ions are implanted in substrate 10 to form p-type layer 40 in advance.

After silicon nitride film 82 is removed, buffer thermal oxide film 80 is subjected to etching using $NH_4$ to have openings 86 corresponding to the flat openings of trenches 12a and 12b. Openings 86 are respectively set to be larger than the openings of trenches 12 to be formed later. By utilizing openings 86 of oxide film 80, As ions are implanted in substrate 10 to form n-type layers 32a and 32b serving as parts of the source and drain diffusion layers (see FIG. 10B). Silicon nitride film 88 is deposited on the entire surface of the resultant structure to have a thickness of about 100 nm. Silicon oxide film 90 is deposited on silicon nitride film 88 to have a thickness of about 500 nm. Stacked films 88 and 90 are subjected to patterning by isotropic etching, typically reactive ion etching (RIE) to have openings 92a and 92b corresponding to the flat openings of trenches 12a and 12b. Patterned stacked films 88 and 90, therefore, function as a mask layer for the formation of trenches 12.

Subsequently, substrate 10 is etched by reactive ion etching using the above mask to form trenches 12a and 12b each having a depth of about 5 $\mu$m, as shown in FIG. 10C. The inner walls of these trenches 12 thus formed are oxidized in a steam atmosphere at 850° C. to form an oxide film (not shown) having a thickness of about 100 nm. After nitride film 90 is removed gas containing $CF_4$, the oxide films in trenches 12 are removed by etching. The formation and removal of the above-described oxide film in trenches 12 are performed to prevent etching damage to the trench inner walls.

First polysilicon layer 18 is uniformly deposited on the inner walls of trenches 12 and the top surface of the substrate, which is continuous therewith, as shown in FIG. 10C. Polysilicon layer 18 has a thickness of, e.g., abut 100 nm. Polysilicon layer 18 is then doped with As ions at a dose of $1 \times 10^{15}/cm^2$, at an acceleration energy of 50 keV, and at an implantation angle of 15°. Upon doping of As ions, polysilicon layer 18 becomes an n-type polysilicon layer. As is diffused from this polysilicon layer 18 is substrate 10 to form $n^-$-type layers 16a and 16b in the inner walls of trenches 12a and 12b, respectively (see FIG. 10C). The diffusion depth of $n^-$-type layers 16 is determined by diffusion temperature and time. In this embodiment, the diffusion depth of $n^-$-type layers 16 is 0.2 $\mu$m or less.

As shown in FIG. 10D, photoresist layer 94 is deposited on the entire surface of the resultant structure, and is patterned to have opening 96. Polysilicon layer 18 is etched by the CDE method using patterned photoresist layer 94. As a result, layer 18 is separated by an element isolation region into two separate layers 18a and 18b. At this time, polysilicon layers 18 are left in transistor formation regions.

Figure 10E:
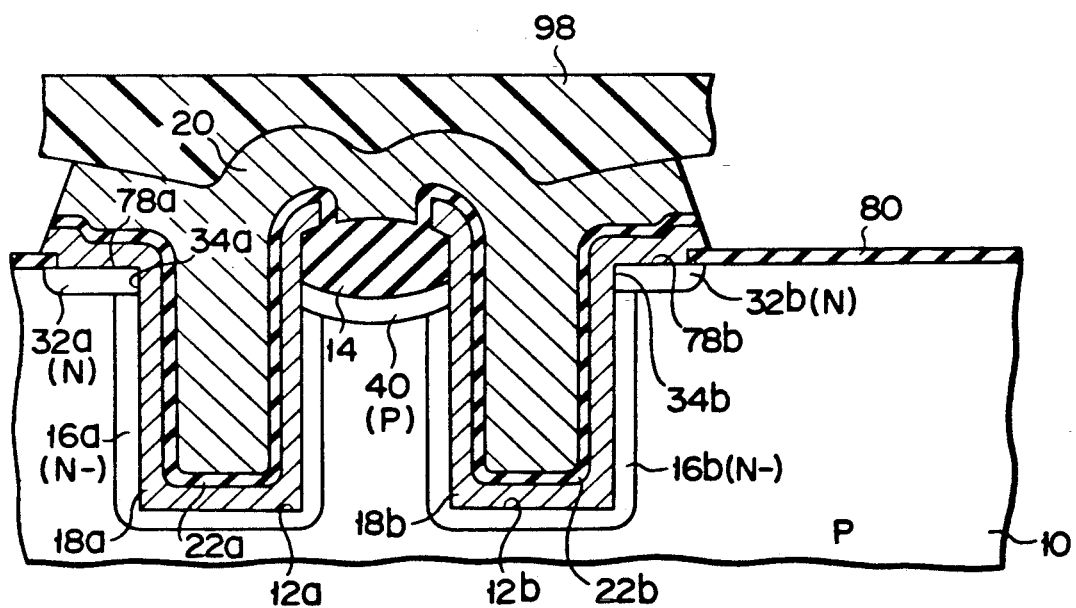

Photoresist layer 94 is then removed. After the surfaces of polysilicon layers 18a and 18b serving as first capacitor electrodes are cleaned, capacitor insulative films 22a and 22b are formed by thermal oxidation to have a thickness of about 10 nm each. Second polysilicon layer 20 doped with an n-type impurity is deposited on the entire surface of the resultant structure. Photoresist layer 98 is deposited on polysilicon layer 20. Layer 20 is etched by the CDE method using $CF_4$ gas to have a gradient of 45°, thereby obtaining second capacitor electrode 20, as shown in FIG. 10E. Subsequently, capacitor insulative films 22 and underlying polysilicon layers 18 are etched using the same mask as in the preceding process, thereby obtaining a structure wherein each of first capacitor electrodes 18a and 18b partially extends to the outside of corresponding trench 12. Each extended portion of first capacitor electrodes 18a and 18b is in direct contact with upper side wall 34 of the corresponding trench and with top surface portion 78 of substrate 10 which is continuous therewith. Second capacitor electrode 20 is provided in common to memory cells to constitute a cell plate, as described above.

Upon removal of photoresist layer 98, thermal oxide film 56 is deposited on second capacitor electrode 20 to have a thickness of about 200 nm, as shown in FIG. 10F. The oxide films left in the transistor regions of substrate 10 are removed, and substrate 10 is exposed at the transistor regions. Thermal oxidation is performed again to form gate oxide films 26. Third polysilicon layer 26 is formed on each gate oxide film 26. Phosphorus ions are implanted in substrate 10 to form n-type layers 28 and 30 as source and drain diffusion layers in substrate 10. CVD insulative film 36 is deposited on the entire surface of the resultant structure, as shown in FIG. 10F. Then, as shown in FIG. 10G, contact holes 37a and 37b are formed in CVD insulative film 36 (in FIG. 10G, only one contact hole 37b is visible). Conductive layer 38 serving as a dRAM bit line is formed on CVD insulative film 36 so as to cover contact holes 37a and 37b.

According to this embodiment, the same effects as in the above-described embodiments can be obtained. Each of first capacitor electrodes 18 is in direct contact with the inner side wall of corresponding trench 12, and at the same time its extended portion is in direct contact with flat top surface 78 adjacent to the trench of substrate 10. Therefore, the contact resistance between n-type layer 32 and first capacitor electrode 18 can be effectively reduced. In order to bring each first capacitor electrode 18 into contact with corresponding n-type layer 32 at top surface 78 of the substrate, which is adjacent to corresponding trench 12 in the manufacturing process of the dRAM, oxide film 80 may be etched to have opening or window 86 larger than the flat opening of trench formation opening 92 prior to the formation of the trench formation mask layer, as described with reference to FIG. 10B. This etching process can be easily performed.

Figure 11:
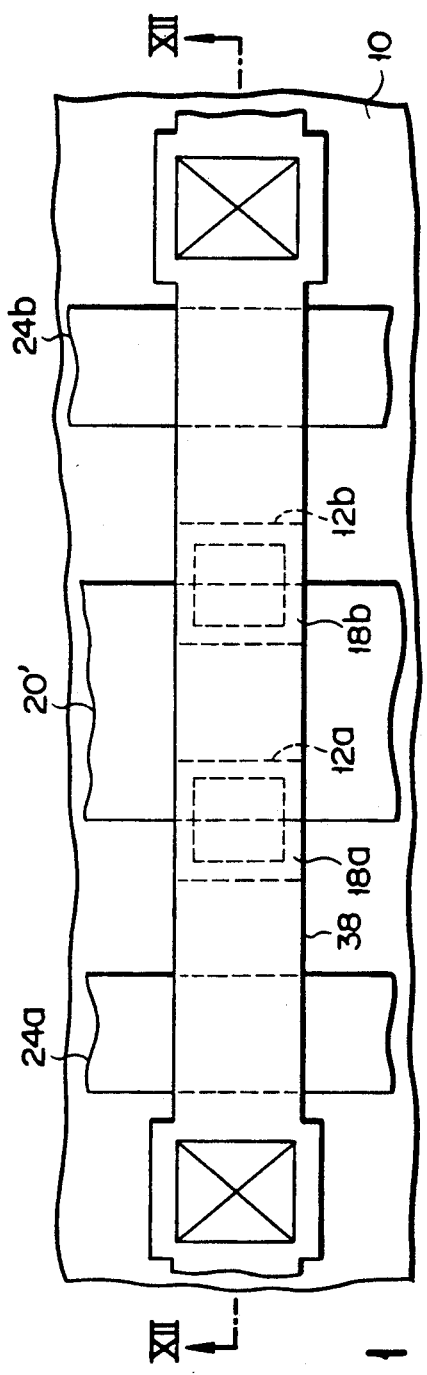
FIG. 11 is a diagram illustrating a plan view of a main part of a dRAM having a trench capacitor structure in accordance with still another embodiment of the present invention.
Figure 12:
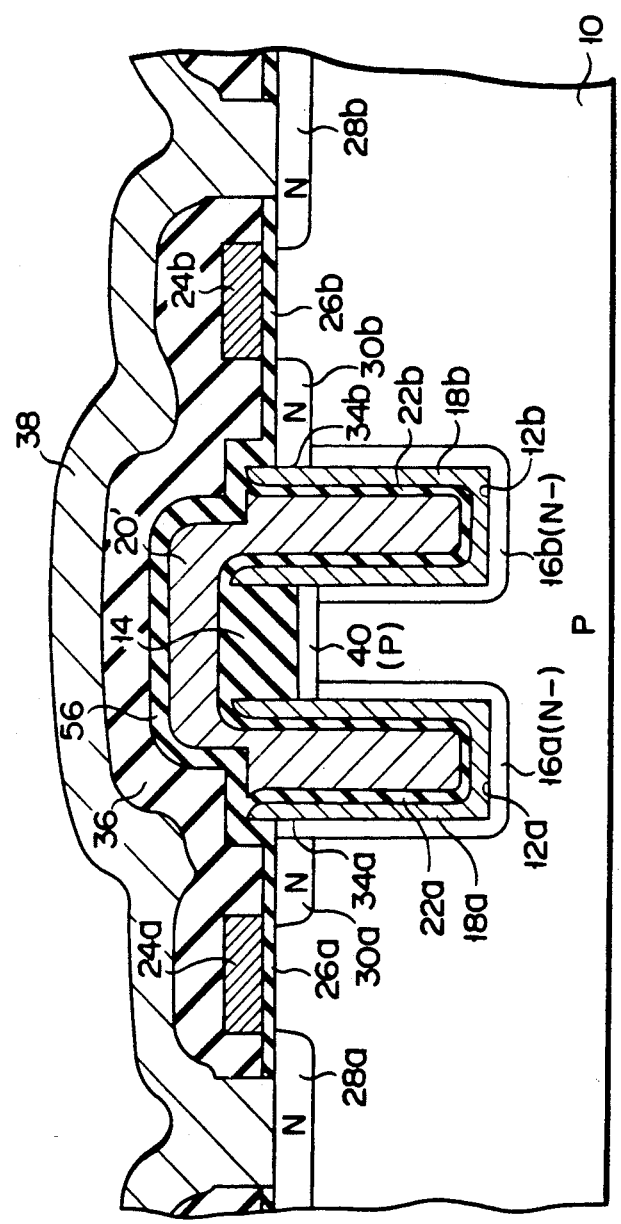
FIG. 12 is a diagram illustrating a sectional structure of the dRAM in FIG. 11 taken along the line XII—XII thereof.

According to a dRAM according to still another embodiment of the present invention shown in FIGS. 11 and 12, second capacitor electrode 20 is patterned on trenches 12a and 12b formed in substrate 10. With this process, narrowed second capacitor electrode 20' is obtained, as is best illustrated in FIG. 11. Such capacitor electrode 20' can be applied to any of the above-described dRAMs. If such a second capacitor electrode is applied to, e.g., the embodiments shown in FIGS. 1 to 6, a margin for mask alignment when the edges of second capacitor electrode 20 are set to extend outside corresponding trenches, a margin for mask alignment of n-type layers 32a and 32b with respect to second capacitor electrode 20, and a margin for mask alignment of gate electrodes 24a and 24b with respect to second capacitor electrode 20 can be eliminated, thereby realizing further micropatterning fabrication of memory cells. In this case, n-type layers 32a and 32b formed in advance in the previous embodiments are not required. Note that second capacitor electrode 20' may be patterned on the edges of trenches 12a and 12b of substrate 10.

A method of forming a p-type layer when a double-layered diffusion structure of p- and n-type layers is formed in substrate trenches 12 in order to improve the punch-through voltage of the dRAM will be described with reference to FIGS. 13A to 13C. Although p-type layer 72 is formed in substrate 10 so as to surround each trench 12 in the embodiment shown in FIG. 6, in this embodiment shown in FIGS. 13A to 13C, p-type layer 100 is formed in the inner side wall of each trench 12 on the basis of the structure in the previous embodiment shown in FIGS. 8 and 9.

Figure 13A:
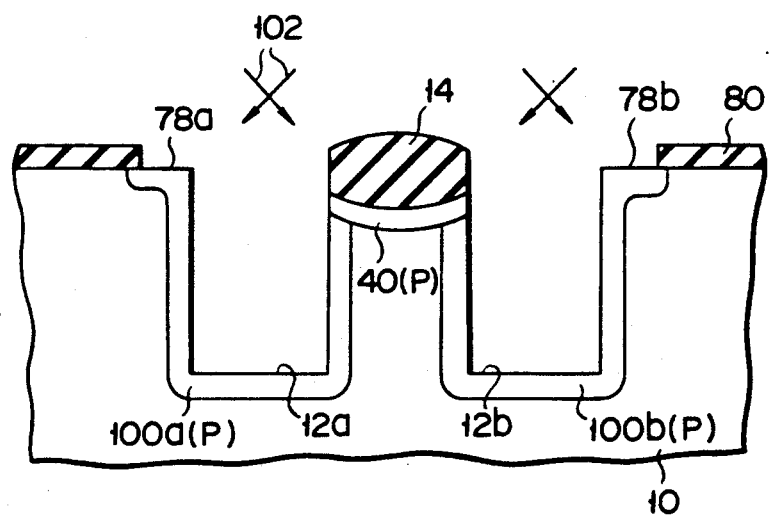
FIGS. 13A to 13C are diagrams illustrating, in cross-section, some of the major steps in the manufacturing process in accordance with still another embodiment of the present invention.

As shown in FIG. 13A, boron ions are implanted in partially exposed substrate 10 through inner side walls of trenches 12a and 12b and top surface portions 78a and 78b using the oblique ion implantation technique at, e.g., 15°, as indicated by reference numeral 102 in FIG. 13A. Thereafter, first polysilicon film 18 is deposited on the resultant structure, as shown in FIG. 13C. After arsenic ions are implanted in film 18, a double-layered diffusion structure constituted by shallow $n^-$-type layer 16 and p-type layer 100 surrounding layer 16 is formed by low-temperature annealing.

Figure 13B:
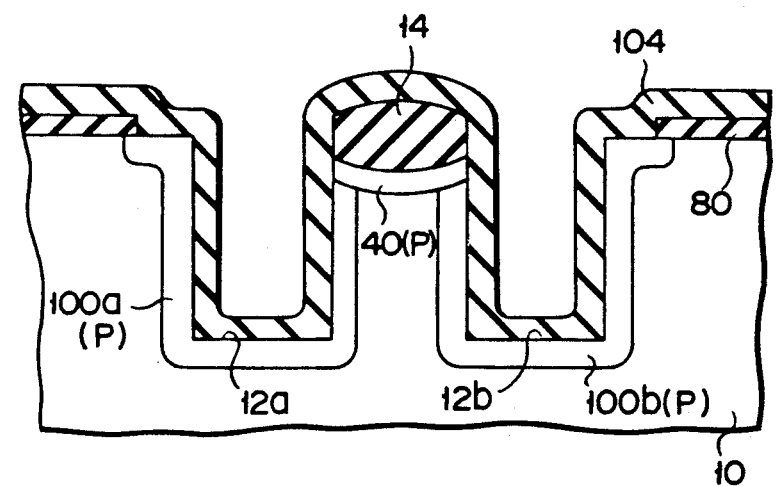
Figure 13C:
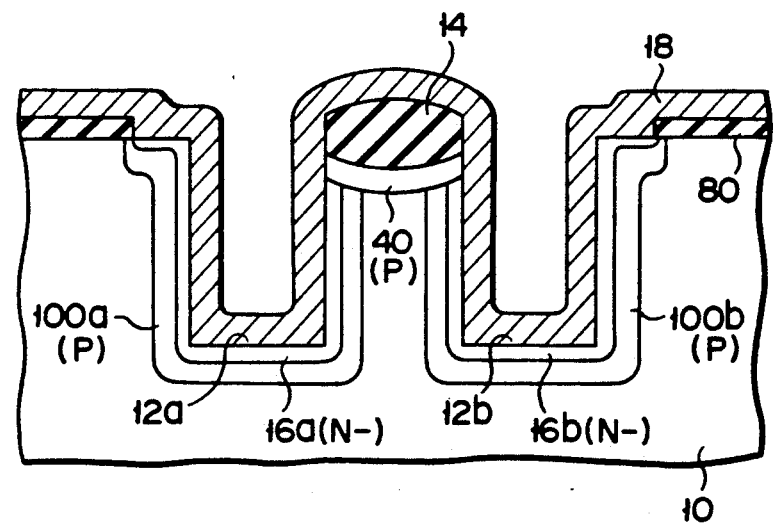

According to another method, after the process in FIG. 13A, BSG film 104 is deposited on the resultant structure, as shown in FIG. 13B. Then, p-type type layer 100 is formed in each trench 12 upon diffusion of an impurity from BSG film 104. Subsequently, $n^-$-type layer 16 is formed in the process in FIG. 13C.

A method of forming trenches 12 according to still another embodiment will be described with reference to FIGS. 14A to 14F. In the manufacturing method described with reference to FIGS. 3A to 3I, if oxide film 48 is left thick after trenches 12 are formed in substrate 10 in the process in FIG. 3C, and is etched, element isolating insulative film 14 is simultaneously etched in the lateral direction. This causes a problem of degradation in element isolating capacity when the distance between adjacent trenches 12a and 12b is desired to be minimized. The method shown in FIGS. 14A to 14F can solve such a technical problem.

As shown in FIG. 14A, element isolating insulative layer 14 similar to that in FIG. 3A is formed on substrate 14. Then, buffer oxide film 42 is formed on insulative film 14 to have a thickness of about 100 nm. Nitride film 46 having a thickness of about 100 nm and oxide film 48 having a thickness of about 500 nm are sequentially stacked on oxide film 42.

As shown in FIG. 14B, photoresist layer 106 is patterned such that parts of its openings overlap element isolating insulative film 14. Films 42, 46, and 48 are etched by reactive ion etching using patterned photoresist layer 106 as a mask. As a result, substrate 10 is partially exposed at its top surfaces, as shown in FIG. 14B.

Figure 14D:
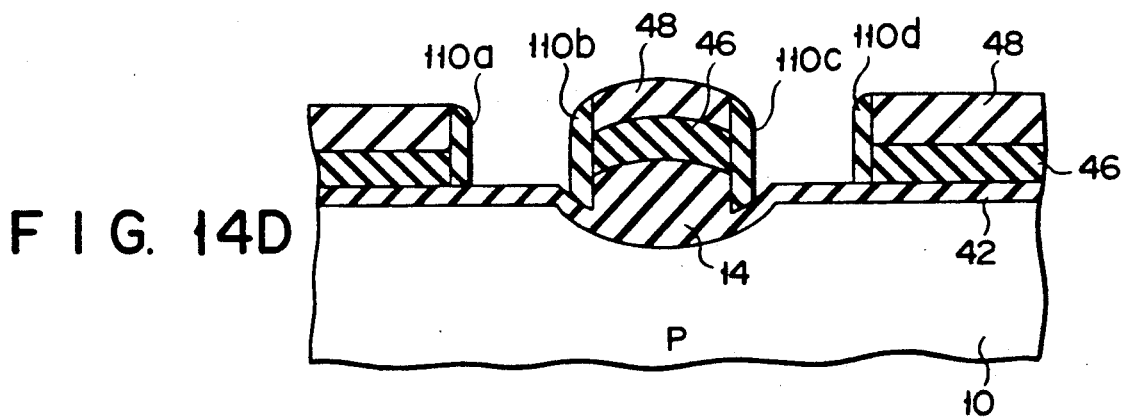

After photoresist layer 106 is removed, thin thermal oxide film 108 having a thickness of about 50 nm is formed on the resultant structure. Nitride film 110 is deposited on the entire surface of the resultant structure to have a thickness of about 100 nm. Nitride film 110 is etched by a depth corresponding to its thickness, using the reactive ion etching technique, thereby obtaining layer portions 110a, 110b, 110c, and 110d left on only the side walls of stacked layers 46 and 48, as shown in FIG. 14D.

Figure 14E:
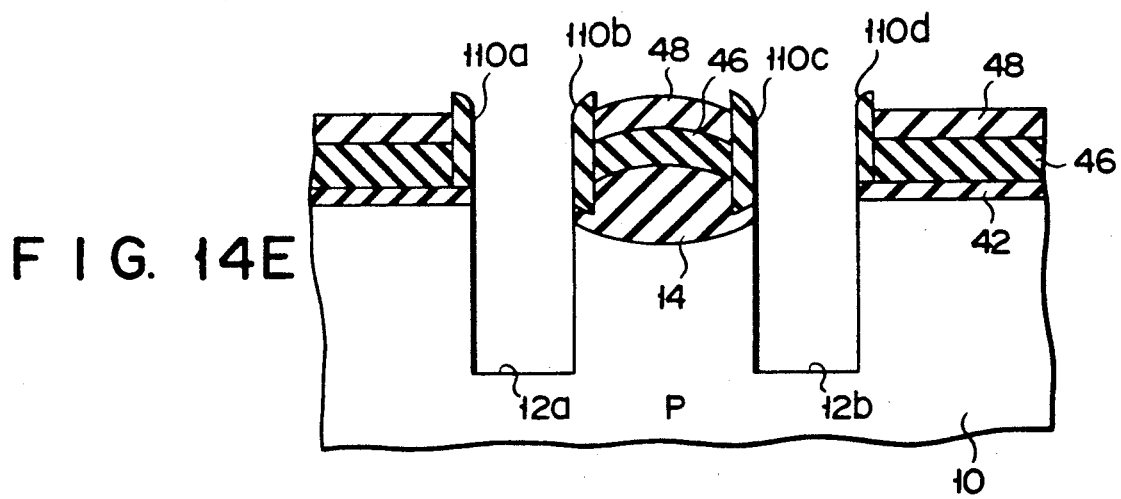

Subsequently, as shown in FIG. 14E, substrate 10 is subjected to an etching process by reactive ion etching using the stacked layers of oxide film 48 and nitride film 110 to form trenches 12a and 12b therein. When the selection ratio of silicon (Si) to CVD oxide silicon ($SiO_2$) is a finite value, oxide film 48 is simultaneously etched in the step of forming trenches 12, and hence its film thickness is reduced. However, oxide film 48 is not completely removed. A layer portion where oxide film 48 is left is removed by etching using $NH_4$ gas. The inner side walls of trenches 12 are thermally oxidized slightly in a depth of about 50 nm. Nitride film 110 is removed by the CDE method. In this CDE process, the trench inner side walls are not further etched, since an oxide film is formed thereon. In this case, the oxide film functions as a trench protective layer.

The oxide film is then removed by etching. With this process, the upper side walls of each trench 12 and part of top flat surface portions continuous therewith are exposed, as shown in FIG. 14F.

Figure 14F:
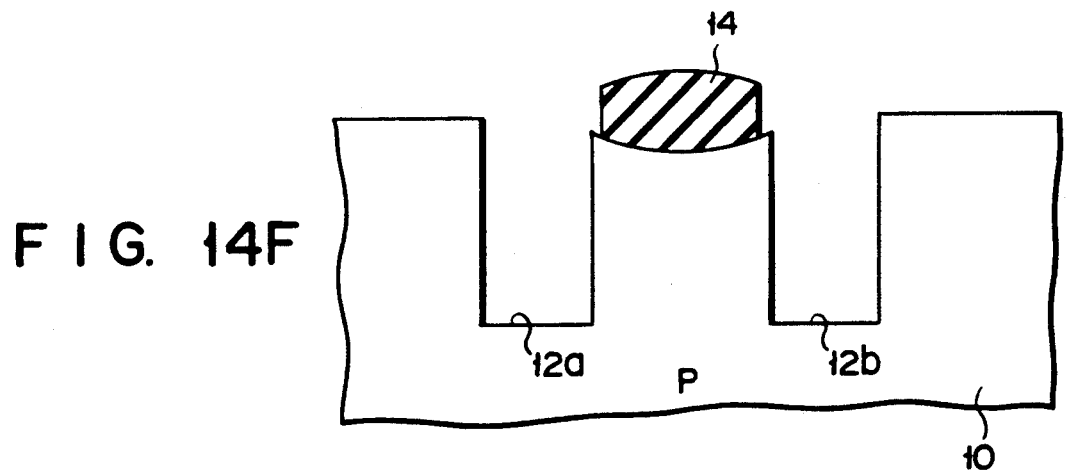

According to the above-described method, in the step of FIG. 14F, even when part of oxide film 48 used as a mask is not etched out and hence is left partially, since the mask opening side surfaces are covered with nitride film 110, exposure of element isolating insulative film 14 can be effectively prevented. Therefore, in the step of removing residual oxide film 48 by etching using $NH_4F$, a loss of element isolating insulative film 14 (decrease in thickness of film 14) can be effectively prevented. Due to this reason, even when trenches 12 are formed so as to overlap the element isolating area of substrate 10, the element isolating capacity of the dRAM is not degraded.

In the above-described embodiments, a relationship between adjacent memory cells along the extending direction of a word line is not particularly described. In the dRAM, when memory cells having the above-described trench structure are arrayed according to a folded bit line arrangement, the gate electrodes of the adjacent memory cells along the word line direction extend on second capacitor electrode 20, i.e., the cell plate region. In such a case, according to the manufacturing process of the above-described embodiments, the gate and capacitor electrodes are capacitor-coupled to each other by an oxide film obtained by thermally oxidizing the capacitor electrode and sandwiched therebetween. Since this thermal oxide film consists of a polysilicon film, it becomes thicker than that consisting of single-crystal silicon. In order to further decrease the capacitance between these electrodes, it is effective to additionally form a CVD insulative film in the capacitor region.

FIG. 15 shows a plan view of a folded bit line type dRAM having the above-described trench structure, wherein gate electrodes 24 consisting of a third polysilicon film extend above substrate 10 as word lines WL of the dRAM. Adjacent cells along the extending direction of word line WL are shifted from each other by a positional phase of 180°. For this reason, as shown in FIG. 15, two gate electrodes 24c and 24d of other adjacent memory cells along the extending direction of word line WL extend between two gate electrodes 24a and 24b shown in FIG. 1. Second capacitor electrode 20 is a cell plate having rectangular openings 112 in the transistor areas of memory cells. Conductive lines 38 function as bit lines BL. Each pair of bit lines BL are connected to sense amplifier 114, as shown in FIG. 15.

A flat memory cell arrangement shown FIG. 16 is featured in that it is a "combination" of the folded bit line arrangement and the open bit line arrangement (to be referred to as a quasi-open bit line arrangement hereinafter). For the sake of simplicity in drawing, substrate 10 is omitted, and word and bit lines WL and BL are illustrated by simple lines. Although the dRAM with the folded bit line arrangement is excellent in noise resistance characteristics, cell plate fabrication is difficult. In contrast to this, the dRAM with the open bit line arrangement is superior in cell plate formation, but inferior in noise resistance characteristics. The flat memory cell arrangement shown in FIG. 16 aims at simultaneously utilizing the advantages of these two different types of cell arrangements.

As shown in FIG. 16, memory cells are divided into a plurality of cell groups each of which includes several trench type memory cells along the extending direction of word line WL. The cell groups are arrayed in accordance with the folded bit line arrangement. In each cell group, cells are arrayed in accordance with the open bit line arrangement. Gate electrodes 24 are commonly provided to the memory cells included in each cell group, thereby constituting word lines WL. As shown in FIG. 16, bit lines BL are provided so as to commonly connect the cells included in different cell groups. The corresponding bit lines BL of cell groups are connected to corresponding sense amplifier circuits 116, thereby obtaining a dRAM which is excellent in noise resistance characteristics and in which cell plate fabrication is easy.

Although the invention has been described with reference to a specific embodiment, it shall be understood by those skilled in the art that numerous modification may be made that are within the spirit and scope of the inventive contribution.

What is claimed is:

1. A manufacturing method of a semiconductor memory device including a memory cell having a transistor with source and drain regions, and a capacitor with a groove structure, said method comprising the steps of:
    forming an insulation layer on a top surface of a semiconductor substrate, said insulation layer being varied in its thickness to define a first layer section and a second layer section which is located adjacent to said first layer section and which is larger in thickness than said first layer section;
    forming a groove in said insulation layer and said substrate in such a manner that said groove overlaps said first and second layer sections, said groove having an inner wall surface and an inner bottom surface;
    forming a first conductive layer so as to cover the top surface of said substrate and to be in direct contact with the inner wall surface and the inner bottom surface of said groove;
    etching said first conductive layer to form a patterned layer section located inside said groove and having a projecting wall portion which is projected out of the top surface of said substrate, said patterned layer section serving as a first capacitor electrode;
    forming a second conductive layer which is insulatively disposed above said first capacitor electrode; and
    etching said second conductive layer to form a second capacitor electrode having a portion insulatively stacked with said first capacitor electrode within said groove, said second capacitor electrode being narrowed in width to have an edge portion which does not extend outward beyond said groove onto the top surface of said substrate.

2. The method according to claim 1, further comprising the step of:
    doping an impurity of a selected conductivity type into the top surface of said substrate so as to provide a semiconductive layer which is located in an opening periphery of said groove and which serves as one of the source and drain regions of the transistor, said first capacitor being in direct contact with said semiconductive layer.

3. The method according to claim 2, further comprising the steps of:
    forming a third conductive layer which is insulatively disposed above the top surface of said substrate at a position adjacent to said groove and which serves as a gate electrode of the transistor; and
    doping an impurity of the selected conductivity type into said substrate with said gate electrode being as a mask, so that the source and drain regions are defined in said substrate.

4. The method according to claim 3, further comprising the step of:
    annealing said first conductive layer before said first conductive layer is etched to from said patterned layer section as said first capacitor electrode, thereby to form an impurity-diffused semiconductor layer which is so formed in said substrate as to surround said groove and to be in contact with one of the source and drain regions of said transistor.

5. The method according to claim 4, wherein the annealing condition is determined so that said semiconductor layer has a preselected diffusion depth essentially not larger than 0.2 micrometers.

6. The method according to claim 5, wherein said diffusion depth is preferably smaller than 0.2 micrometers.

7. A manufacturing method of a semiconductor memory device including a memory cell having a transistor with source and drain regions, and a capacitor with a trench structure, said method comprising the steps of:
    forming an insulation layer on a top surface of a semiconductive substrate;
    forming in said insulation layer and said substrate a groove which has an opening, an inner wall surface and an inner bottom surface;
    forming on the resultant body a first conductive layer which is etched to form a patterned layer section located inside said groove which is in direct contact with the inner wall surface and the inner bottom surface, said patterned layer section serving as a first capacitor electrode;
    forming a second conductive layer above said first capacitor electrode such that the second layer is electrically separated from the first layer; and
    etching said second layer to form a second capacitor electrode which has a portion insulatively stacked with said first capacitor electrode within said groove, and which is narrowed in width to have an outside edge portion which is positioned at a certain position above the opening of said groove.

8. The method according to claim 7, wherein said patterned layer section is formed by an etching to have a projecting wall portion which is projected out of the top surface of said substrate.

9. The method according to claim 8, further comprising the step of:
    annealing said first layer to form an impurity-diffused region which surrounds said groove in said substrate.

10. The method according to claim 9, wherein said first layer is annealed before it is etched to from said patterned layer section.

11. The method according to claim 8, further comprising the step of:

forming a transistor that is positioned on the periphery of said groove on the top surface of said substrate, said transistor having a source and a drain region one of which is in contact with said impurity-diffused region.

12. The method according to claim 11, wherein said step of forming a transistor comprises the substeps of:

forming a gate electrode above said substrate; and doping an impurity of a selected type of conductivity which is opposite to that of said substrate to form a couple of impurity-doped regions with the gate electrode being as a mask, so that the source and drain regions are defined in said substrate.

13. The method according to claim 12, wherein one of said impurity-doped regions is formed so as to allow said impurity-diffused region and said patterned layer section to be electrically connected thereto.

* * * * *